(12) United States Patent
Takashima et al.

(10) Patent No.: US 7,825,578 B2
(45) Date of Patent: Nov. 2, 2010

(54) YELLOW LIGHT EMITTING DEVICE WITH HIGH LUMINANCE

(75) Inventors: Suguru Takashima, Anan (JP); Masato Aihara, Komatsushima (JP); Tomohisa Kishimoto, Anan (JP); Hitomi Miki, Tokushima (JP); Kenichi Aoyagi, Anan (JP); Takeshi Kihara, Tokushima (JP)

(73) Assignee: Nichia Corporation, Anan-shi (JP)

( * ) Notice: Subject to any disclaimer, the term of this patent is extended or adjusted under 35 U.S.C. 154(b) by 501 days.

(21) Appl. No.: 11/711,766

(22) Filed: Feb. 28, 2007

(65) Prior Publication Data
US 2007/0205711 A1 Sep. 6, 2007

(30) Foreign Application Priority Data
Mar. 1, 2006 (JP) ............................. 2006-055014

(51) Int. Cl.
*H01J 1/62* (2006.01)
*H01J 63/04* (2006.01)

(52) U.S. Cl. ........................... 313/502; 313/498; 257/98

(58) Field of Classification Search .......... 313/483–512
See application file for complete search history.

(56) References Cited

U.S. PATENT DOCUMENTS

| | | | |
|---|---|---|---|
| 5,998,925 A | 12/1999 | Shimizu et al. | |
| 6,521,915 B2 * | 2/2003 | Odaki et al. | ................ 257/98 |
| 7,132,786 B1 | 11/2006 | Debray et al. | |
| 7,233,104 B2 * | 6/2007 | Kuma et al. | ................ 313/501 |
| 7,298,550 B2 * | 11/2007 | Nishiwaki et al. | ............ 359/384 |
| 2005/0116619 A1 | 6/2005 | Kuma et al. | |
| 2005/0184638 A1 * | 8/2005 | Mueller et al. | ............... 313/485 |
| 2007/0114562 A1 * | 5/2007 | Radkov et al. | ............... 257/103 |

FOREIGN PATENT DOCUMENTS

| | | | |
|---|---|---|---|
| CN | 1643992 A | | 7/2005 |
| GB | 2406900 | * | 4/2005 |
| JP | 2002-237617 A | | 8/2002 |
| JP | 2003-505583 A | | 2/2003 |
| WO | WO-98/05078 A1 | | 2/1998 |

* cited by examiner

*Primary Examiner*—Toan Ton
*Assistant Examiner*—Britt D Hanley
(74) *Attorney, Agent, or Firm*—Birch, Stewart, Kolasch & Birch, LLP

(57) ABSTRACT

An object of the present invention is to provide a light emitting device which emits light of deep yellowish color with high luminance. The light emitting device of the present invention comprises a light emitting element having a peak emission wavelength shorter than 490 nm, a fluorescent material for wavelength conversion which absorbs light from the light emitting element and emits light of a wavelength longer than that of the light from the light emitting element, and a filter which cuts off a part of a mixed light produced by mixing the light of the light emitting element and the light of the fluorescent material, wherein the light transmitted through the filter has a chromaticity coordinate on the chromaticity diagram according to CIE 1931 plotted in a region defined by a first point (x=0.450, y=0.450), a second point (x=0.250, y=0.650), a third point (x=0.350, y=0.750) and a fourth point (x=0.250, y=0.750) and in the region defined by a closed curve consisting of the monochromatic locus and the purple boundary.

2 Claims, 24 Drawing Sheets

YELLOW LIGHT EMITTING DEVICE WITH HIGH LUMINANCE

BACKGROUND OF THE INVENTION

1. Field of the Invention

The present invention relates to a light emitting device which emits yellowish light, for example, a light emitting device used as a backlight for liquid crystal display and other displays.

2. Description of the Related Art

There is demand for a light emitting device which emits yellow light for such applications as signals, illuminations and signboards.

The light source for a Signboard is currently a fluorescent lamp which is inexpensive and high emission efficiency. However, the fluorescent lamp has short life which requires frequent replacements and a high running cost. The fluorescent lamp also has limitations on the size and configuration thereof, which make it impossible to design the signboard at will or manufacture it at a low cost. Also from the view point of environment, it is called for to use a light source which does not involve mercury. With this background, much attention is focused on a light emitting device based on a light emitting element.

A light emitting device using a light emitting element is small in size, high in the power efficiency and emits light with bright color. Also the light emitting element is made of a semiconductor and is therefore free from burnout. Moreover, the light emitting element is far smaller than the fluorescent lamp, and therefore allows it to make a signboard in a free design when used as the light source thereof. The light emitting element also has such remarkable features as excellent startup characteristic, high resistance to vibration and robustness to endure a lot of on/off operation cycles. Because of these advantageous properties of the light emitting element, light emitting devices which employ semiconductor light emitting elements such as light emitting diode (hereinafter referred to as LED) and laser diodes (hereinafter referred to as LD) are used as the light source in various applications.

Prior art technologies related to the light emitting device using the light emitting element can be found in Japanese Unexamined Patent Publication (Kokai) No. 2002-237617 and National Publication of Translated Version (Kohyo) No. 2003-505583. For example, Japanese Unexamined Patent Publication (Kokai) No. 2002-237617 discloses a light emitting device for emitting yellow light which uses a yellow color LED. This yellow color LED has double heterojunction structure wherein an active layer formed from InGaAlP-based material is sandwiched by cladding layers formed from InGaAlP-based material, the structure being formed on a GaP substrate.

National Publication of Translated Version (Kohyo) No. 2003-505583 discloses, not a light emitting device that emits yellow light as described above, but a light emitting device that emits white light by combining a blue color LED that emits blue light and a fluorescent material which emits yellow light or yellowish green light. The fluorescent material has the garnet structure $A_3B_5O_{12}$ activated with Ce. First component A of this fluorescent material includes at least one element selected from among a group consisting of Y, Lu, Se, La, Gd and Sm, and second component B includes at least one element selected from among a group consisting of Al, Ga and In. The fluorescent material has garnet structure wherein at least a part of the first component A is replaced with Tb. The type $A_3B_5O_{12}$ fluorescent material is excited by blue light emitted by the LED and emits yellow light. Thus this light emitting device produces white light through mixing of the blue light emitted by the LED and the yellow light emitted by the type $A_3B_5O_{12}$ fluorescent material. This light emitting device is widely used because of low power consumption and easy control of the driving of the LED.

The light emitting device which uses yellow color LED currently available is not capable of changing the color tone of the yellow light. This is because there are some variations among the products, but the color tone of the light emitted by the LED is substantially constant. When it is desired to make a yellow color LED emitting light of a particular color tone, the active layer or the like may be doped with an impurity. However, it is not easy to control the color tone by this method. Moreover, there has been no yellow color LED developed for practical use which can emit light with a level of luminance high enough for use in a signboard.

A white light emitting device which combines a blue color LED and a type $A_3B_5O_{12}$ fluorescent material can work as a yellow light emitting device by increasing the content of the type $A_3B_5O_{12}$ fluorescent material. However, since the light emitting device of this type mixes blue light and yellow light, the resultant light tends to have whitish yellow color. In order to obtain yellow light of a desired color tone, it is necessary to have a large amount of the type $A_3B_5O_{12}$ fluorescent material disposed in a very high density in the vicinity of the LED. A large amount of the type $A_3B_5O_{12}$ fluorescent material disposed in a very high density causes such a problem that yellow light emitted by the type $A_3B_5O_{12}$ fluorescent material is blocked by other particles of the type $A_3B_5O_{12}$ fluorescent material and it becomes difficult to take out light from the light emitting device in the output direction. As a result, although the light emitting device emits yellow light, the luminance of emission is low and yellow light emitting device of high luminance cannot be obtained.

SUMMARY OF THE INVENTION

With the background described above, an object of the present invention is to provide a light emitting device which emits deep yellow light with high luminance.

The present inventors completed the present invention through research aimed at solving the problems described above.

The present invention provides a light emitting device comprising a light emitting element having a peak emission wavelength shorter than 490 nm, a fluorescent material for wavelength conversion which absorbs light from the light emitting element and emits light of a wavelength longer than that of the light from the light emitting element and a filter which cuts off a part of a mixing light produced by mixing the light of the light emitting element and the light of the fluorescent material, wherein the light transmitted through the filter has a chromaticity coordinate on the chromaticity diagram according to CIE 1931 plotted in a region defined by a first point (x=0.450, y=0.450), a second point (x=0.250, y=0.650), a third point (x=0.250, y=0.750) and a fourth point (x=0.550, y=0.450) and in the region defined by a closed curve consisting of the monochromatic locus and the purple boundary. Accordingly, the present invention can provide the light emitting device which emits light of a color ranging from dark green to yellowish red with high luminance.

The filter preferably transmits light of wavelengths shorter than 480 nm at a rate of about 10% or less when a maximum transmittance to light of wavelengths ranging from 380 nm to 730 nm is taken as 100%. This makes it possible to cut off the light mainly from the light emitting element and provide light emitting device having large values of chromaticity coordinates x, y.

It is preferable that the mixed light prior to passing the filter has such a mixing ratio as the ratio of an intensity of the light component having a peak emission wavelength of the fluorescent material to an intensity of the light component having a peak emission wavelength of the light emitting element that is about 1.0 or higher and not higher than about 20. This makes it possible to provide the light emitting device having high luminance.

It is preferable that the mixed light prior to passing the filter includes a light component of peak emission wavelength of the light emitting element and a light component of peak emission wavelength of the fluorescent material, and has a y value of the chromaticity coordinate not lower than about 0.400 on the chromaticity diagram according to CIE 1931. This makes it possible to provide light emitting device having high luminance.

Therefore, the light emitting device of the present invention having the construction described above has a service life longer than that of the fluorescent lamp and emits light of a color ranging from dark green to yellowish red color with high luminance.

DESCRIPTION OF REFERENCE NUMERALS

Figure 1:
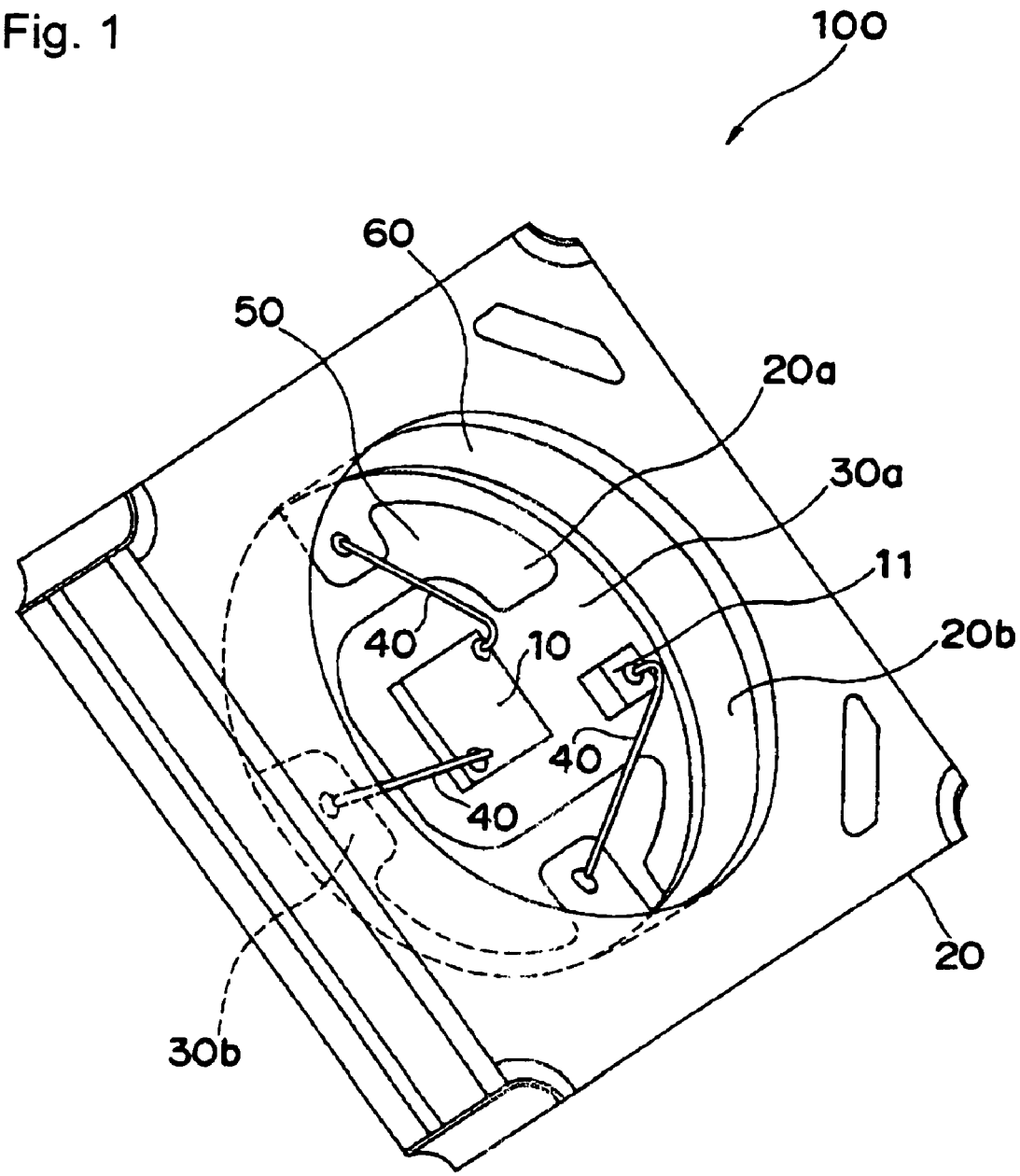
FIG. 1 is a perspective view schematically showing the light emitting device according to an embodiment.

10 Light emitting element
11 Protective element
20 Package
20a Bottom surface
20b Side surface
30a First electrode
30b Second electrode
40 Conductive wire
50 Fluorescent material
60 Sealing member
100 Light emitting device

DETAILED DESCRIPTION OF THE INVENTION

The light emitting device of the present invention and a method for manufacturing the same will now be described below by way of embodiment and examples. It is understood that the present invention is not limited to these embodiment and examples.

Embodiments

Light Emitting Device

A light emitting device 100 according to the embodiment comprises a light emitting element 10 serving as the excitation light source, a package 20 having a recess, a fluorescent material 50 and a filter (not shown).

The recess of the package 20 has a bottom surface 20a on which the light emitting element 10 is placed and a side surface 20b extending from the bottom surface 20a. A first electrode 30a and a second electrode 30b are provided on the bottom surface 20a of the recess of the package 20. The first electrode 30a and the second electrode 30b make a pair of positive and negative electrodes. The first electrode 30a continues to a corner and a back surface of the outside of the package 20 and is electrically connected to an external electrode at the corner and the back surface. The second electrode 30b similarly continues to other corner and the back surface of the outside of the package 20 and is electrically connected to an external electrode at the corner and the back surface.

The light emitting element 10 is placed via a bonding material on the first electrode 30a provided on the bottom surface 20a of the recess of the package 20. The light emitting element 10 is electrically connected to the first electrode 30a and the second electrode 30b via conductive wires 40. A protective element 11 is used to protect the light emitting element 10 from overcurrent. The protective element 11 is also placed on the first electrode 30a. The protective element 11 is electrically connected directly to the first electrode 30a and via the conductive wire 40 to the second electrode 30b. The recess of the package 20 is filled with a sealing member 60 which includes a fluorescent material 50.

The filter is placed on the front side (a light emitting side) of the package 20, and it may also be fixed directly on the package 20 or disposed at a distance from the package 20. The filter cuts off a part of the mixed light produced by mixing the light of the light emitting element 10 and the light of the fluorescent material 50.

Figure 2:
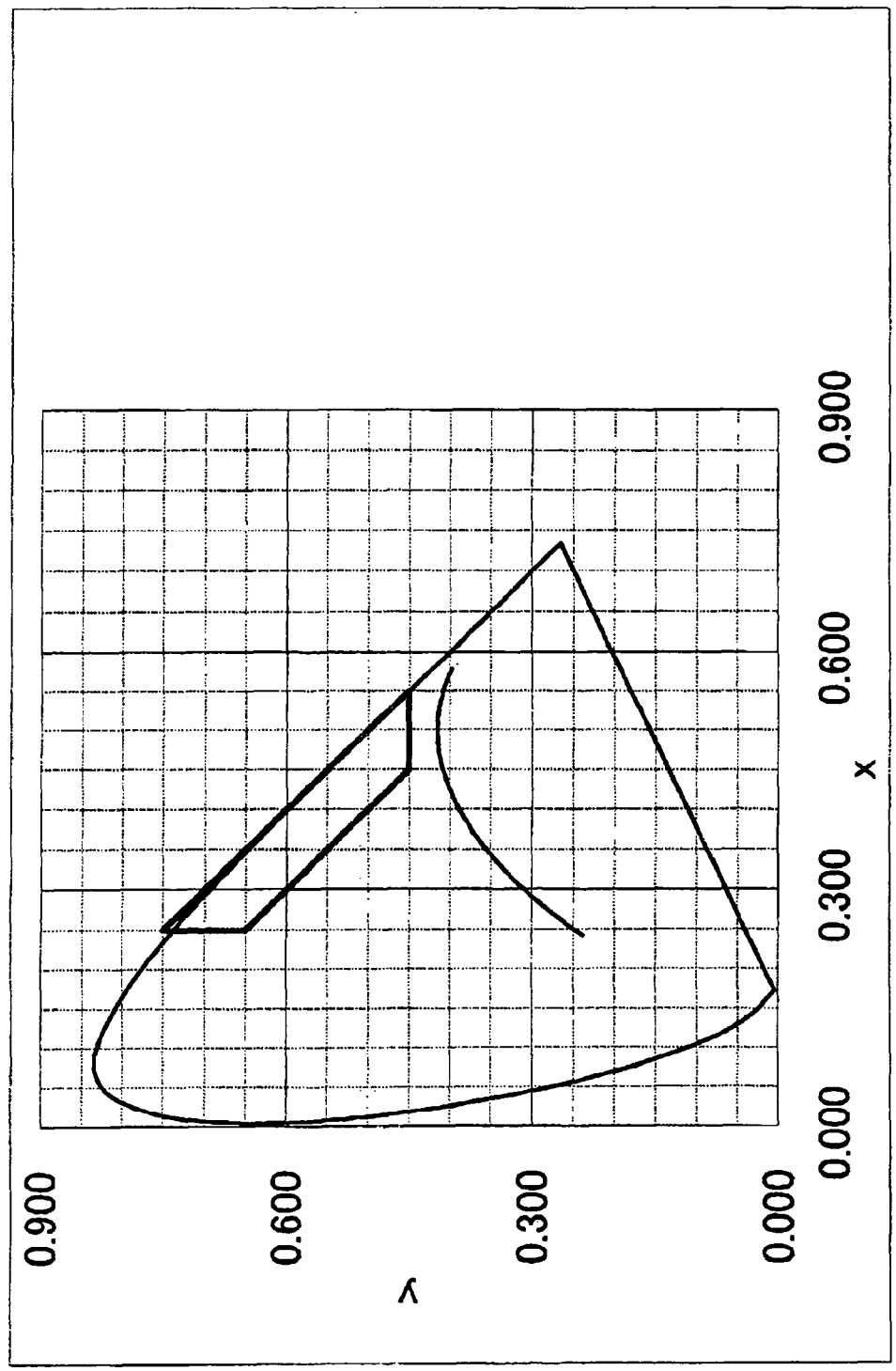
FIG. 2 shows chromaticity diagram (CIE 1931) and the range of the chromaticity coordinates of the light emitted by the light emitting device according to the embodiment.

The light emitting device 100 emits light produced by mixing the light from the light emitting element 10 and fluorescent light from the fluorescent material 50, while a part of the mixed light is cut off by the filter. The mixed light produced by the light emitting device 100, after passing through the filter, has a chromaticity coordinate on the chromaticity diagram according to CIE 1931 plotted in a region defined by a first point (x=0.450, y=0.450), a second point (x=0.250, y=0.650), a third point (x=0.250, y=0.750) and a fourth point (x=0.550, y=0.450) and in the region defined by a closed curve consisting of the monochromatic locus and the purple boundary. The monochromatic locus refers to a curve which represents the stimulation by a monochromatic light in the chromaticity diagram, the convex curve in the upper left direction of the diagram shown in FIG. 2. The purple boundary refers to a straight line connecting both ends of the monochromatic locus, the line segment extending from a lower left point to an upper right point in FIG. 2. Chromaticity of a real color is represented by a point located within a closed curve comprising the monochromatic locus and the purple boundary of the chromaticity diagram.

Light represented by a point located within a closed curve comprising the monochromatic locus and the purple boundary, and represented within a region defined by the four points described above in the chromaticity diagram shows a color proximate to a pure color, and includes yellowish colors such as green, yellowish green, yellow and yellowish red. Since the light emitting device of the present invention emits light of deep yellow color proximate to a pure color, it can be preferably used in such applications as signal, illumination and signboard.

The emission wavelength of the light emitting element 10, the emission wavelength of the fluorescent material 50 and the cutoff wavelength of the filter are selected so that the chromaticity coordinates of the mixed light have values that fall in the region described above.

It is preferable that 100% of light emitted by the light emitting element 10 serving as the excitation light source illuminates the fluorescent material 50 without leaking through the space between the particles of the fluorescent material 50. For this purpose, it is necessary to place the fluorescent material 50 with a high density in the vicinity of the light emitting element 10. However, when the fluorescent material 50 placed with a high density, light emitted by the fluorescent material 50 is blocked by other particles of fluorescent material 50, and it becomes difficult to take out light from the light emitting device 100 to the outside.

Also in the light emitting device 100 of the present invention, a part of the mixed light produced by mixing the light from the light emitting element 10 and the light from the fluorescent material 50 is cut off by the filter. If a large part of the mixed light is cut off, a large amount of heat is accumulated in the filter which makes it necessary to take measures for dissipating heat from the filter. Thus in order to achieve light emission with high luminance while suppressing the amount of light which is cut off by the filter, it is preferable to decrease the intensity of a leaking light which is emitted by the light emitting element 10 and leaks out without being absorbed by the fluorescent material 50, thereby increasing the intensity of a non-leaking light that excites the fluorescent material 50.

For the purpose of the present invention, therefore, intensity ratio was defined for the mixed light prior to passing the filter, as the ratio of the intensity of light having a peak emission wavelength of the fluorescent material to the intensity of light having the peak emission wavelength of the light emitting element 10. The ratio of the intensity of the light having the peak emission wavelength of the fluorescent material to the intensity of the light having the peak emission wavelength of the light emitting element 10 (intensity ratio) is preferably about 1.0 or higher and not higher than about 20. The intensity ratio is more preferably about 1.1 or higher and not higher than about 10. This makes it possible to increase the intensity of the non-leaking light that excites the fluorescent material 50 and decrease the intensity of the leaking light which is lost without passing the filter, so that luminance of light emitted by the light emitting device after passing the filter can be made higher.

(Light Emitting Element)

The light emitting element 10 is, for example, a semiconductor light emitting element based on GaN, made by forming an n-type semiconductor compound layer on an insulating substrate such as a sapphire substrate and forming a p-type semiconductor compound layer thereon. While the light emitting element 10 is mounted on the first electrode 30a facing the sapphire substrate, it may also be mounted on first electrode 30a facing the semiconductor compound layers. An n-side electrode is formed on the top surface of the n-type layer formed from the n-type semiconductor compound, and the n-side electrode is electrically connected to the first electrode 30a via the conductive wire 40. A p-side electrode is formed on the top surface of the p-type layer formed from the p-type semiconductor compound, and the p-side electrode is electrically connected to the second electrode 30b via the conductive wire 40.

For the light emitting element 10, one that has peak emission wavelength shorter than 490 nm is used. Since the light emitting element 10 emits light of high energy intensity, the fluorescent material 50 that is excited by this light emits light with high efficiency. As a result, the yellow light emitting device which emits light with high luminance is provided. The peak emission wavelength of the light emitting element 10 is preferably in a range from 360 nm to 490 nm, and more preferably from 430 nm to 480 nm. This is because light of wavelength in this range has lower energy than ultraviolet ray, and therefore causes less energy to be accumulated in the filter. There is not limitation on the type of the light emitting element 10 as long as it emits light with a peak emission wavelength shorter than 490 nm, and InGaN, AlGaN or InAlGaN may be used as well as GaN.

(Package)

The package 20 has the recess which opens toward the front of the light emitting element 100. The recess has the bottom surface 20a on which the light emitting element 10 is placed and the side surface 20b extending from the bottom surface 20a. Configuration of the package 20 is not limited to this. For example, projection of the bottom of the package 20 may have various shapes including circle, oval, rectangle, polygon or any other similar shape. There is also no limitation on the size of the package 20. For example, the bottom of the package 20 may have surface area from about 0.1 $mm^2$ to 100 $mm^2$. Thickness of the package 20 may be from about 100 μm to about 20 mm. While the mouth of the recess of the package 20 has round shape, it may also be oval, rectangle, polygon or any other similar shape.

While the package 20 of the embodiment is made of ceramics, the material is not limited to this. The package 20 can be typically formed from one of known materials such as thermoplastic engineering polymer which is a heat resistant resin and thermosetting resin, or a combination of two or more kinds selected therefrom. Materials preferably used for the package 20 include liquid crystal polymer (LCP), polyphenylene sulfide (PPS), aromatic nylon (PPA), epoxy resin and hard silicone resin. Among these, thermoplastic engineering polymer is preferable for the advantage related to the cost. The material used to form the package 20 may include inorganic filler such as titanium oxide, zinc oxide, alumina, silica, barium titanate, calcium phosphate, calcium carbonate, white carbon, talc, magnesium carbonate, boron nitride, glass fiber or the like, which may be added individually or in combination of two or more kinds. In addition, additives such as antioxidant, thermal stabilizer, light stabilizer or the like may also be added.

(First Electrode, Second Electrode)

The first electrode 30a and the second electrode 30b are molded integrally with the package 20 which is made of ceramics. The first electrode 30a and the second electrode 30b can be formed in thin metal films from an alloy of copper, iron or the like having high heat conductivity. The first electrode 30a and the second electrode 30b can be formed, for example, by a series of processes such as application of resist, exposure to irradiation, etching and removal of the resist. If required, surface of the metal film which has been formed may be covered with nickel or gold by electroless plating or electrolytic plating.

(Protective Element)

The protective element 11 is, together with a semiconductor element such as the light emitting element 10, housed in the recess of the package 20. In FIG. 1, the protective element 11 is placed together with the light emitting element 10 on the first electrode 30a. Such a constitution may also be employed as the protective element is placed via a junction member on the first electrode 30a, and the light emitting element 10 is placed thereon.

The protective element 11 is provided for the purpose of protecting the other semiconductor elements from destruction due to over voltage. The protective element 11 may be formed from semiconductor or a material other than semiconductor. The protective element 11 may be Zener diode, capacitor, diac or the like.

Zener diode is a protective element comprising a p-type semiconductor region connected to a positive electrode and an n-type semiconductor region connected to a negative electrode. The Zener diode is used by connecting the electrodes thereof to the first electrode 30a and the second electrode 30b so as to establish inverse parallel connection between the negative electrode and the positive electrode of the Zener diode and the p-side electrode and the n-side electrode of the light emitting element 10. When the Zener diode is connected in this way, the voltage applied across the positive and negative electrodes of the light emitting element 10 is restricted to the Zener voltage even when an over-voltage is applied between the first electrode 30a and the second electrode 30b. Thus the light emitting element 10 is protected from the over-voltage, and destruction and deterioration of the element are prevented from occurring.

In case a capacitor is used as the protective element 11, the capacitor may be a chip capacitor for surface mounting. A surface-mounted type chip capacitor has band-shaped electrodes on both sides thereof. The surface-mounted chip capacitor is used by connecting the electrodes thereof to the first electrode 30a and the second electrode 30b so as to establish parallel connection with the positive electrode and the negative electrode of the light emitting element 10. When an over-voltage is applied between the first electrode 30a and the second electrode 30b, the over-voltage causes a current to flow to charge the capacitor, so as to cause an instantaneous drop in the terminal voltage of the capacitor. As a result, since the voltage applied to the light emitting element is prevented from increasing, the light emitting element can be protected from the over-voltage. Noise including high frequency component can also be preventing from affecting the light emitting element as the capacitor works as a bypass capacitor.

(Sealing Member)

The sealing member 60 protects the light emitting element 10 from foreign matter such as dust, dirt and moisture. The sealing member 60 includes the fluorescent material 50 mixed therein. The fluorescent material 50 absorbs light emitted by the light emitting element 10 and emits light of a wavelength longer than that of the light from the light emitting element 10, thereby effectively converting the wavelength of the light. Use of the fluorescent material in converting the wavelength is preferable for the reason of high energy conversion efficiency. The sealing member 60 may also include filler, dispersant, pigment, light absorbing material or the like.

The sealing member 60 may be silicone resin, epoxy resin, amorphous polyamide resin, fluorocarbon resin or the like which has high heat resistance. The fluorescent material 50 is preferably rare earth aluminate fluorescent material, silicate-based fluorescent material or thiogallate fluorescent material activated with rare earth element such as Ce. However, the present invention is not limited to this constitution and various fluorescent materials having a peak emission wavelength in a range from 495 nm to 585 nm may be used.

(Filter)

The filter cuts off a component of light having particular wavelengths. Transmittance of the filter to light of wavelengths shorter than 480 nm is preferably 10% or less in proportion to transmittance to light in wavelength range from 380 nm to 730 nm, which is taken as 100%. Such a filter is capable of cutting off most of the light emitted by the light emitting element 10, thereby controlling the light produced by the light emitting device to have a color resembling that of light emitted by the fluorescent material. There is no restriction on the material that constitutes the filter, which may be formed from acrylic resin, polycarbonate, glass, translucent ceramics or the like.

(Fluorescent Material)

The fluorescent material 50 is included in the sealing member 60. Inorganic fluorescent materials and fluorescent dyes may be used for the fluorescent material 50, while an inorganic fluorescent material is preferably used. The fluorescent material is preferably at least one kind selected from among alkaline earth metal element aluminate fluorescent material, alkaline earth element silicate, alkaline earth element thiogallate, or rare earth element aluminate activated with lanthanoid element such as Ce, oxide-nitride-based fluorescent material activated mainly with lanthanoid element such as Eu, Ce, etc.

Specifically, the following fluorescent materials may be used, but the present invention is not limited to these materials.

The alkaline earth metal element aluminate fluorescent materials include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R and $BaMgAl_{10}O_{17}$:R (R is at least one element selected from among Eu, Mn and a combination of Eu and Mn).

The alkaline earth sulfide-based fluorescent materials include $SrGa_2S_4$: Eu, $La_2O_2S$: Eu, $Y_2O_2S$: Eu, and $Gd_2O_2S$: Eu.

The rare earth aluminate-based fluorescent materials activated mainly with lanthanoid element such as Ce include YAG fluorescent materials having compositions of $Y_3Al_5O_2$: Ce, $(Y_{0.8}Gd_{0.2})_3Al_5O_{12}$:Ce, $Y_3(Al_{0.8}Gd_{0.2})_5O_{12}$:Ce and (Y, Gd)$_3$(Al, Ga)$_5O_{12}$. There are also $Tb_3Al_5O_{12}$:Ce and $Lu_3Al_5O_{12}$:Ce where a part or the whole of Y is replaced with Tb, Lu or the like.

The fluorescent materials described above may also include at least one element selected from among Eu, Ce, Tb, Cu, Ag, Au, Cr, Nd, Dy, Co, Ni and Ti as required.

The oxynitride fluorescent material activated mainly with lanthanoid element such as Eu, Ce includes at least one kind of group II element selected from a group consisting of Be, Mg, Ca, Sr, Ba and Zn, and at least one kind of group IV element selected from a group consisting of C, Si, Ge, Sn, Ti, Zr and Hf. Specifically, the oxynitride-based fluorescent material has such a composition as represented by general formula $L_xM_yO_zN_{(2/3)X+(4/3)Y-(2/3)Z}$:R or $L_xM_yQ_TO_zN_{(2/3)X+4/3)Y+T-(2/3)Z)}$:R (L is at least one kind of group II element selected from a group consisting of Be, Mg, Ca, Sr, Ba and Zn, M is at least one kind of group IV element selected from a group consisting of C, Si, Ge, Sn, Ti, Zr and Hf, Q is at least one kind of group III element selected from a group consisting of B, Al, Ga and In, O is oxygen, N is nitrogen, and R is a rare earth element, while ranges of the parameters are 0.5<X<1.5, 1.5<Y<2.5, 0<T<0.5 and 1.5<Z<2.5). For example, $BaSi_2O_2N_2$:Eu, $CaSi_2O_2N_2$:Eu, and $SrSi_2O_2N_2$:Eu may be used.

Fluorescent materials other than the fluorescent materials described above may also be used as long as similar performance and effects are provided.

The fluorescent material 50 may be any fluorescent material having a peak emission wavelength longer than the peak emission wavelength of the light emitting element 10, preferably in a range from 495 nm and 585 nm, which makes it possible to achieve predetermined chromaticity coordinates and higher emission efficiency.

The fluorescent material 50 preferably has the form of spherical particles which can be packed more densely. However, the fluorescent material 50 may also consist of oval or articular particles.

The fluorescent material 50 is not limited to one kind, and may be constituted from a mixture of two or more kinds. The fluorescent material 50 may also consist of only one kind having large particles and small particles mixed.

EXAMPLE 1

The present invention will now be described by way of examples. The light emitting device used in examples is that described in relation to the embodiment. FIG. 1 is a perspective view schematically showing the light emitting device of Examples 1 to 29.

Figure 3:
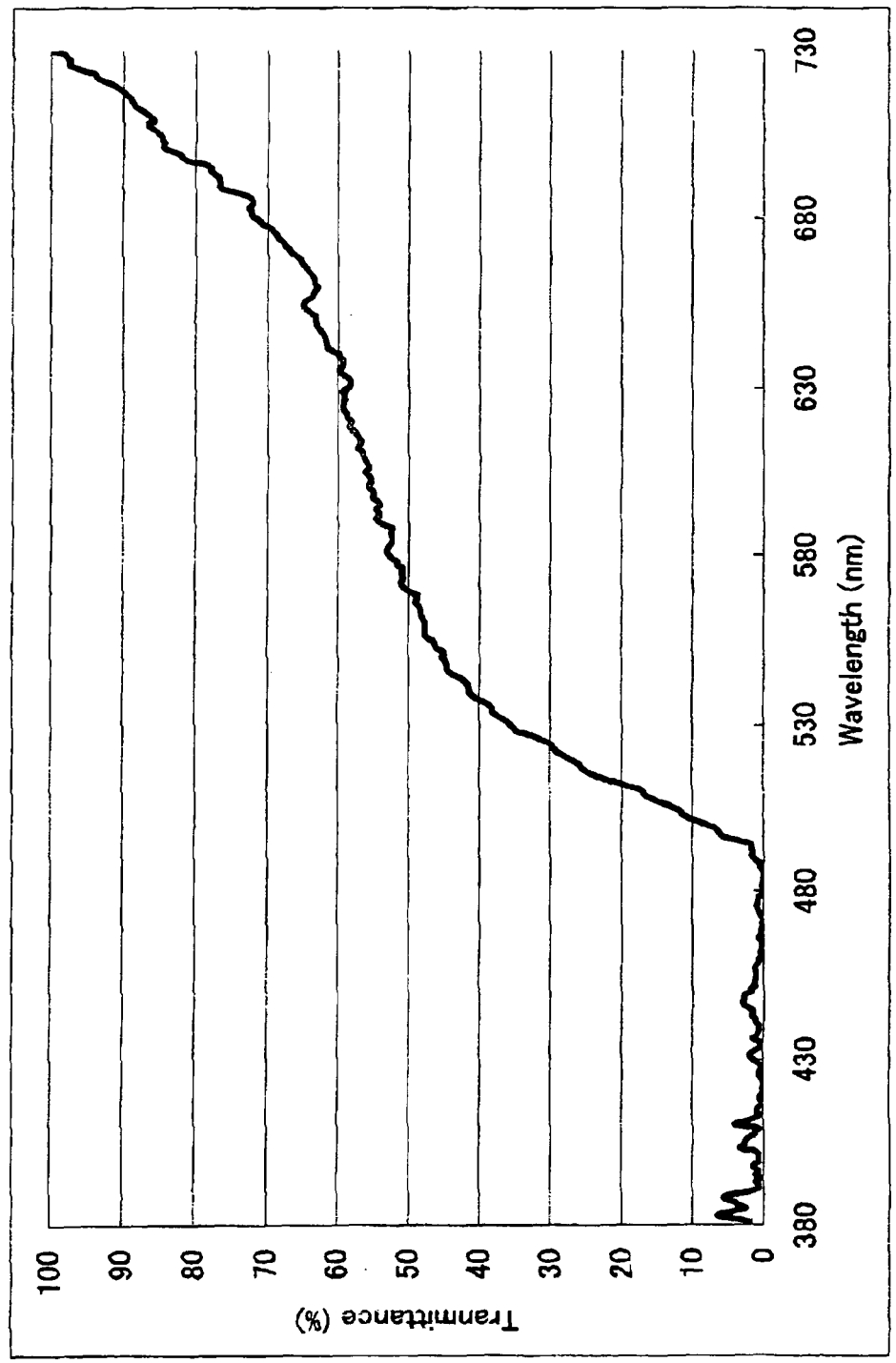
FIG. 3 is a graph showing the transmittance of filter used in Examples 1 to 29.

FIG. 3 shows the transmittance of the filter used in Examples 1 to 29. Transmittance is given in terms of a value relative to the transmittance of the filter at 730 nm which is assumed to be 100%. The filter cuts off the light of wavelengths shorter than 480 nm with transmittance of 10% or less.

EXAMPLES 1 to 7

Figure 4:
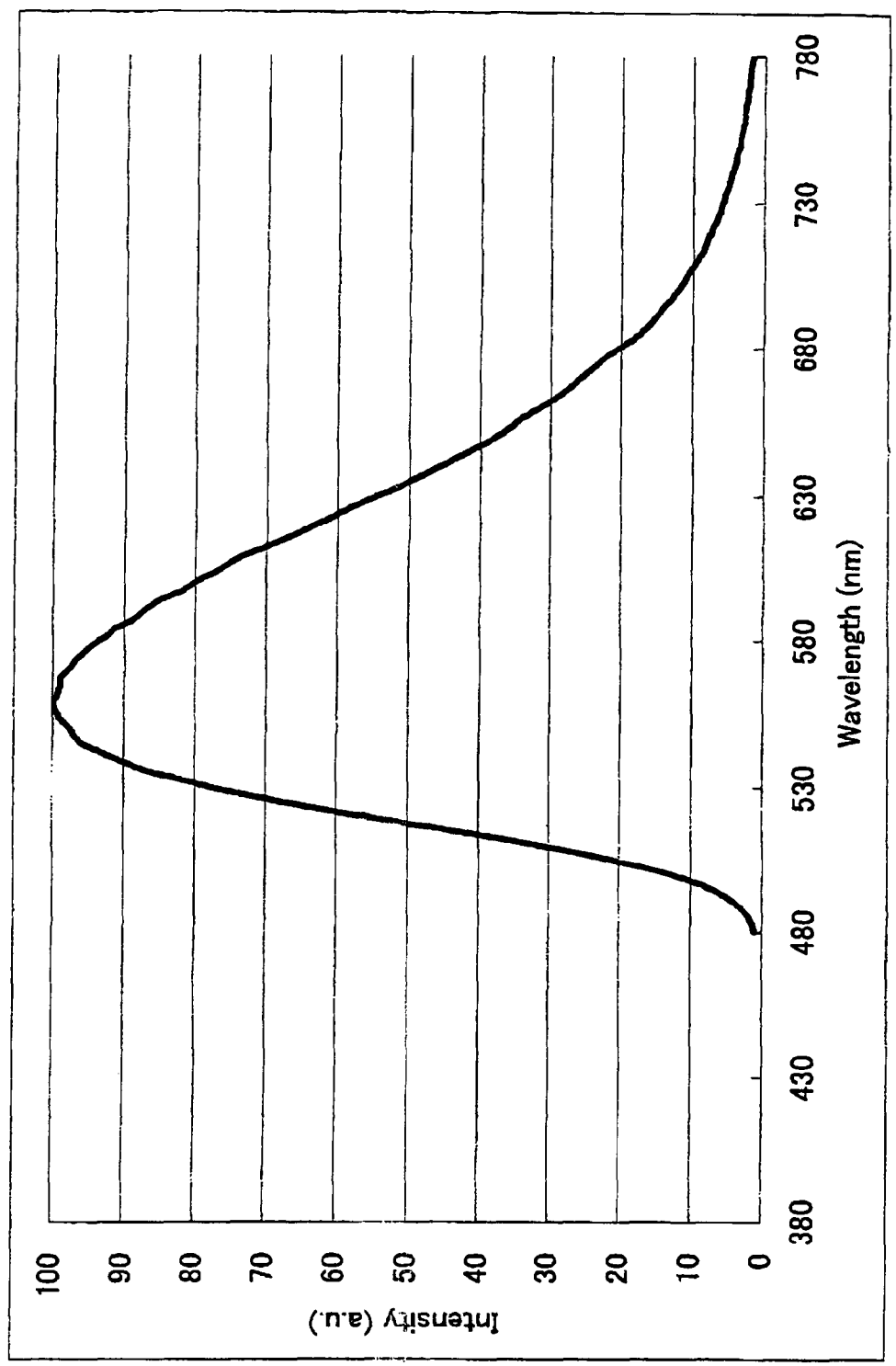
FIG. 4 is an emission spectrum of $(Y, Gd)_3Al_5O_{12}:Ce$ fluorescent material excited with light having wavelength of 450 nm.
Figure 5A:
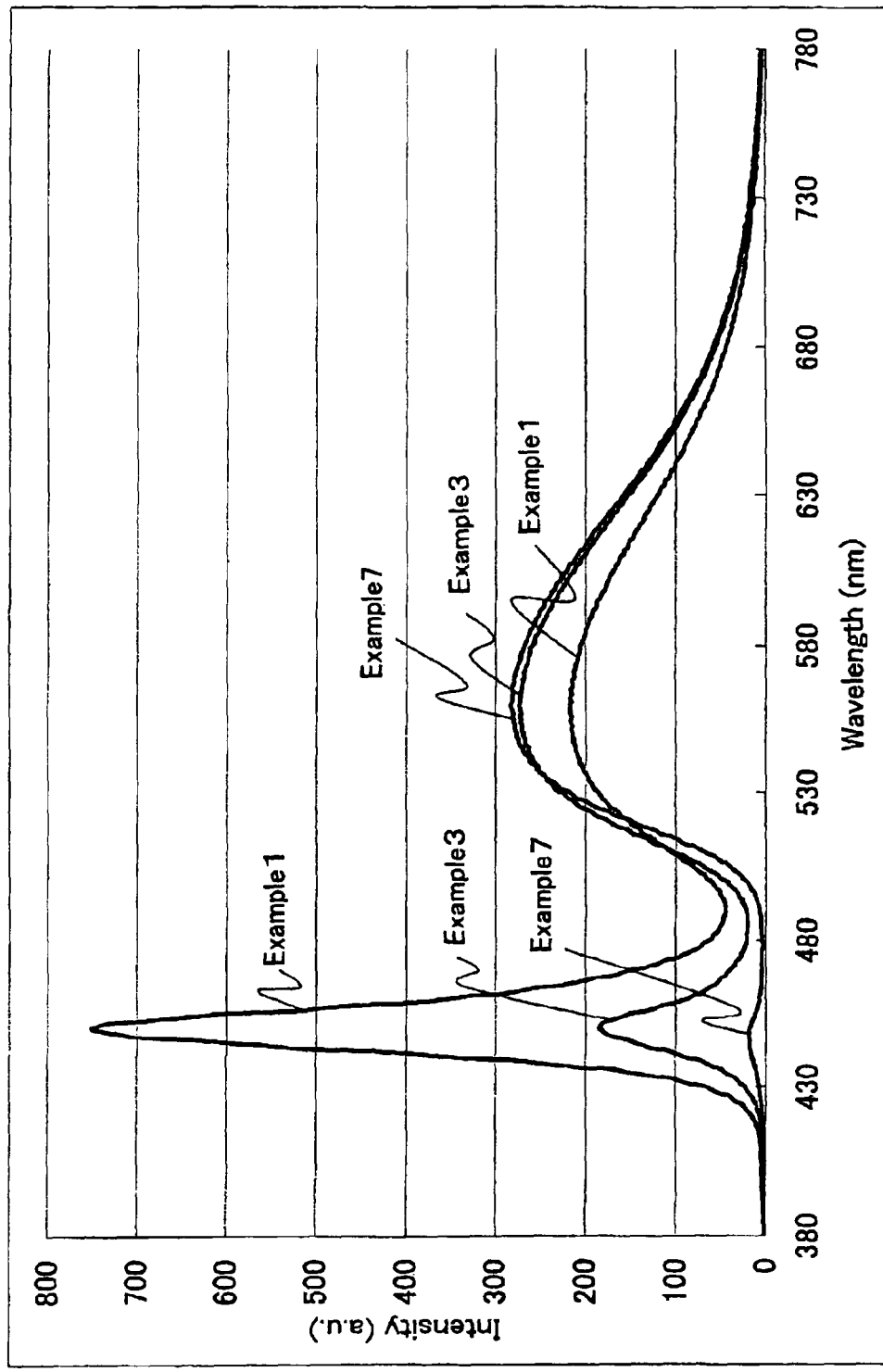
FIGS. 5A and 5B are emission spectra of the light emitting device according to Examples 1 to 7, the emission spectra being measured on the mixed light yet to pass the filter. The fluorescent material was excited by the light emitted by the light emitting element.
Figure 5B:
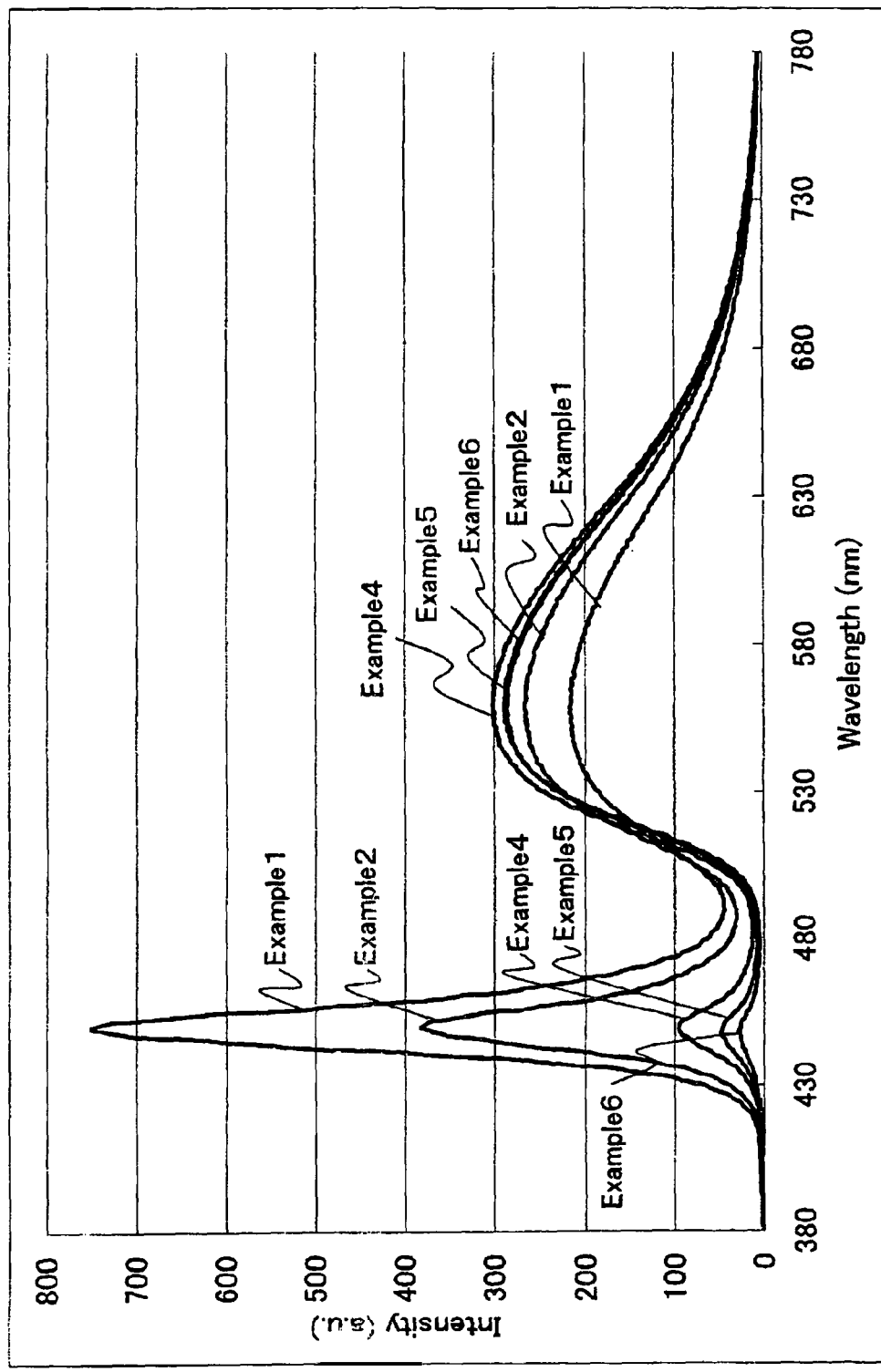
Figure 6:
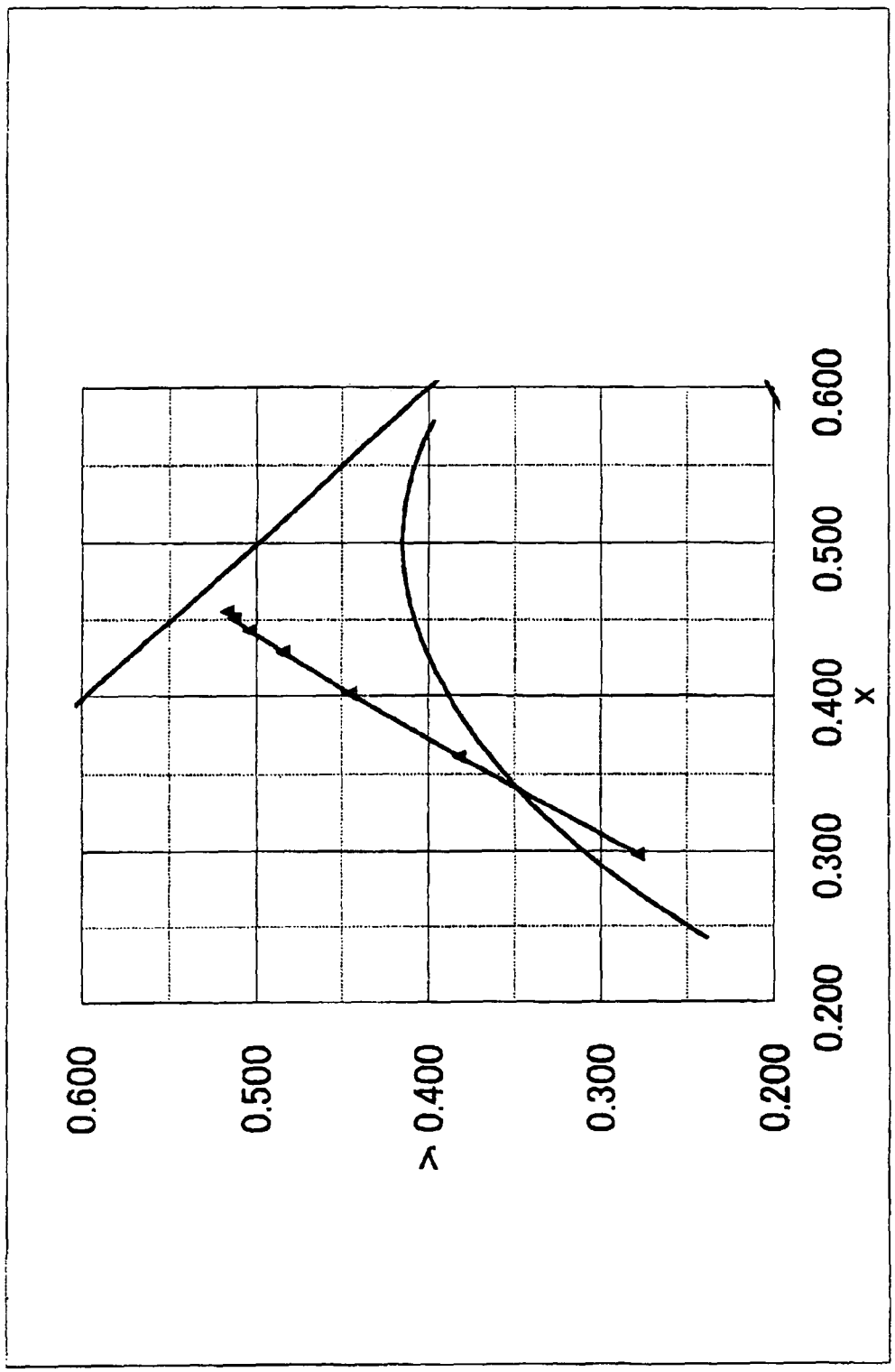
FIG. 6 shows the chromaticity diagram (CIE 1931) in which chromaticity coordinates of the light emitted by the light emitting device according to Examples 1 to 7 are plotted, the color being measured on light emitted by the fluorescent material that was excited by the light emitted by the light emitting element and yet to pass the filter.
Figure 7:
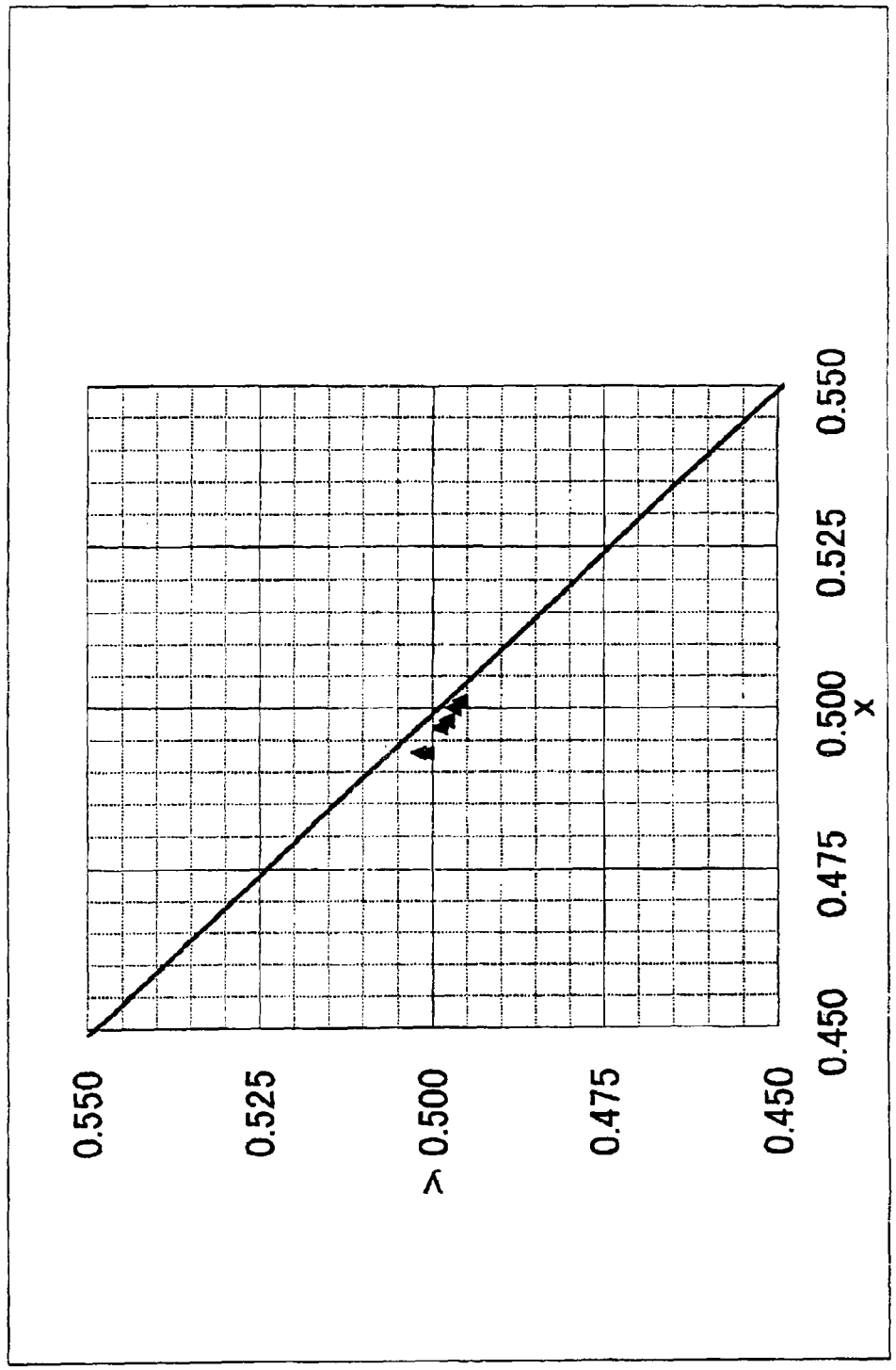
FIG. 7 shows the chromaticity diagram (CIE 1931) in which chromaticity coordinates of the light emitted by the light emitting device according to Examples 1 to 7 and passed the filter are plotted.

The light emitting device according to Examples 1 to 7 will now be described. FIG. 4 shows an emission spectrum of (Y, Gd)$_3Al_5O_{12}$ fluorescent material excited by light having wavelength of 450 nm. FIGS. 5A and 5B show emission spectra of the fluorescent material excited by light from the light emitting element according to Examples 1 to 7 (before passing the filter). FIG. 6 shows chromaticity coordinates (CIE 1931) of light from the fluorescent material excited by light from the light emitting element according to Examples 1 to 7 (before passing the filter). FIG. 7 shows chromaticity coordinates (CIE 1931) of light from the light emitting device according to Examples 1 to 7.

The light emitting device 100 according to Examples 1 to 7 comprises the light emitting element 10, the package 20 having the recess consisting of the bottom surface 20a on which the light emitting element 10 is placed and the side surface 20b extending from the bottom surface 20a, the fluorescent material 50 and the filter (not shown). The light emitting element 10 emits blue light with peak emission wavelength located near 450 nm. The fluorescent material 50 is (Y, Gd)$_3Al_5O_{12}$:Ce fluorescent material. The sealing member 60 is silicone resin. The light emitting device 100 of Example 1 has 10 g of the fluorescent material 50 included in 100 g of the sealing member 60. The light emitting devices 100 of Examples 2 to 7 have 20 g to 70 g of the fluorescent material 50 included in 100 g of the sealing member 60. A predetermined quantity of the sealing member 60 including the fluorescent material 50 is dripped into the recess of the package 20.

Emission characteristic of the light emitting device 100 is measured when the fluorescent material 50 is excited by the light from the light emitting element 10 according to Examples 1 to 7. Table 1 shows the emission characteristic measured as the fluorescent material 50 is excited by the light from the light emitting element 10 according to Examples 1 to 7. The emission characteristic is measured before the light passes the filter.

TABLE 1

| | Amount of fluorescent material | Vf vol [V] | Luminance of light emission Φv [lm] | Chromaticity coordinates | |
|---|---|---|---|---|---|
| | | | | x | y |
| Example 1 | 10 g | 3.37 | 17.1 | 0.298 | 0.278 |
| Example 2 | 20 g | 3.37 | 20.3 | 0.361 | 0.382 |
| Example 3 | 30 g | 3.37 | 20.4 | 0.401 | 0.445 |
| Example 4 | 40 g | 3.37 | 22.2 | 0.429 | 0.484 |

TABLE 1-continued

| | | | | | |
|---|---|---|---|---|---|
| Example 5 | 50 g | 3.36 | 21.0 | 0.443 | 0.504 |
| Example 6 | 60 g | 3.37 | 21.0 | 0.451 | 0.513 |
| Example 7 | 70 g | 3.36 | 20.3 | 0.455 | 0.517 |

| | Emission spectrum | | |
|---|---|---|---|
| | LED Peak wavelength (nm) | Fluorescent material Peak wavelength (nm) | Ratio in intensity of component Fluorescent material/LED |
| Example 1 | 450 | 562 | 0.3 |
| Example 2 | 450 | 559 | 0.7 |
| Example 3 | 450 | 560 | 1.5 |
| Example 4 | 450 | 560 | 3.2 |
| Example 5 | 448 | 558 | 6.1 |
| Example 6 | 449 | 554 | 10.3 |
| Example 7 | 447 | 559 | 14.8 |

These results show that colors of light from the light emitting device according to Examples 1 to 7 before passing the filter lie on a substantially straight line connecting two points having chromaticity coordinates of x=0.298, y=0.278 and x=0.455, y=0.517. The light emitting device 100 of Example 1 emits light with white color having a little blue tinge. Yellow-color light component gradually increases from Example 2 to Example 7, so that the light emitting device 100 of Example 7 emits light with light yellow color. The ratio in intensity of component of peak emission wavelength of the fluorescent material 50 to the component of peak emission wavelength of the light emitting element 10 gradually increases from 0.3 in Example 1 to 14.8 in Example 7. This means that, as the content of the fluorescent material 50 increases, intensity of light which is emitted by the light emitting element 10 and passes between the particles of the fluorescent material 50 so as to emerge from the light emitting device 100 decreases.

Emission characteristics of the light emitting devices 100 according to Examples 1 to 7 are measured. Table 2 shows the emission characteristic of the light emitting device 100 according to Examples 1 to 7, measured after the light has passed the filter. Luminance values of emission of the light emitting device 100 according to Examples 2 to 7 are given in terms of percentage relative to that of the light emitting device 100 of Example 1.

TABLE 2

| | Amount of fluorescent material | Chromaticity coordinates | | Luminance emission (%) |
|---|---|---|---|---|
| | | x | y | |
| Example 1 | 10 g | 0.493 | 0.501 | 100 |
| Example 2 | 20 g | 0.493 | 0.502 | 122 |
| Example 3 | 30 g | 0.497 | 0.499 | 125 |
| Example 4 | 40 g | 0.497 | 0.499 | 137 |
| Example 5 | 50 g | 0.498 | 0.498 | 130 |
| Example 6 | 60 g | 0.500 | 0.497 | 131 |
| Example 7 | 70 g | 0.501 | 0.496 | 127 |

These results show that the values of chromaticity coordinates of the light from the light emitting device 100 remain substantially constant regardless of changes in the content of the fluorescent material 50 included in the sealing member 60. Luminance of emission, in contrast, increases gradually from Example 1 to Example 4, and decreases gradually from Example 5 to Example 7. Luminance reaches a peak value in Example 4.

Table 1 and Table 2 show that light, obtained by exciting the $(Y, Gd)_3A_5O_{12}$:Ce fluorescent material by using a light emitting element having a peak emission wavelength at 450 nm and passing the emission of the fluorescent material through a filter which cuts off light of wavelengths shorter than 480 nm, has substantially constant color with chromaticity coordinates in ranges of x=0.493 to 0.501 and y=0.496 to 0.502. Luminance of emission of the light emitting device after passing the filter becomes highest when the ratio in intensity of the component having a peak emission wavelength of the fluorescent material to the component having a peak emission wavelength of the light emitting element is 3.2. This means that higher luminance cannot be achieved simply by decreasing the intensity of light emitted by the light emitting element which serves as the exciting light source.

The luminance of light emission can be decreased while keeping the color constant by either decreasing or increasing the content of the fluorescent material 50. When the content of the fluorescent material 50 is decreased, it is made possible to manufacture the light emitting device 100 at a lower cost. When the content of the fluorescent material 50 is increased, it is made possible to reduce the heat accumulated in the filter.

EXAMPLES 8 TO 12

Figure 8:
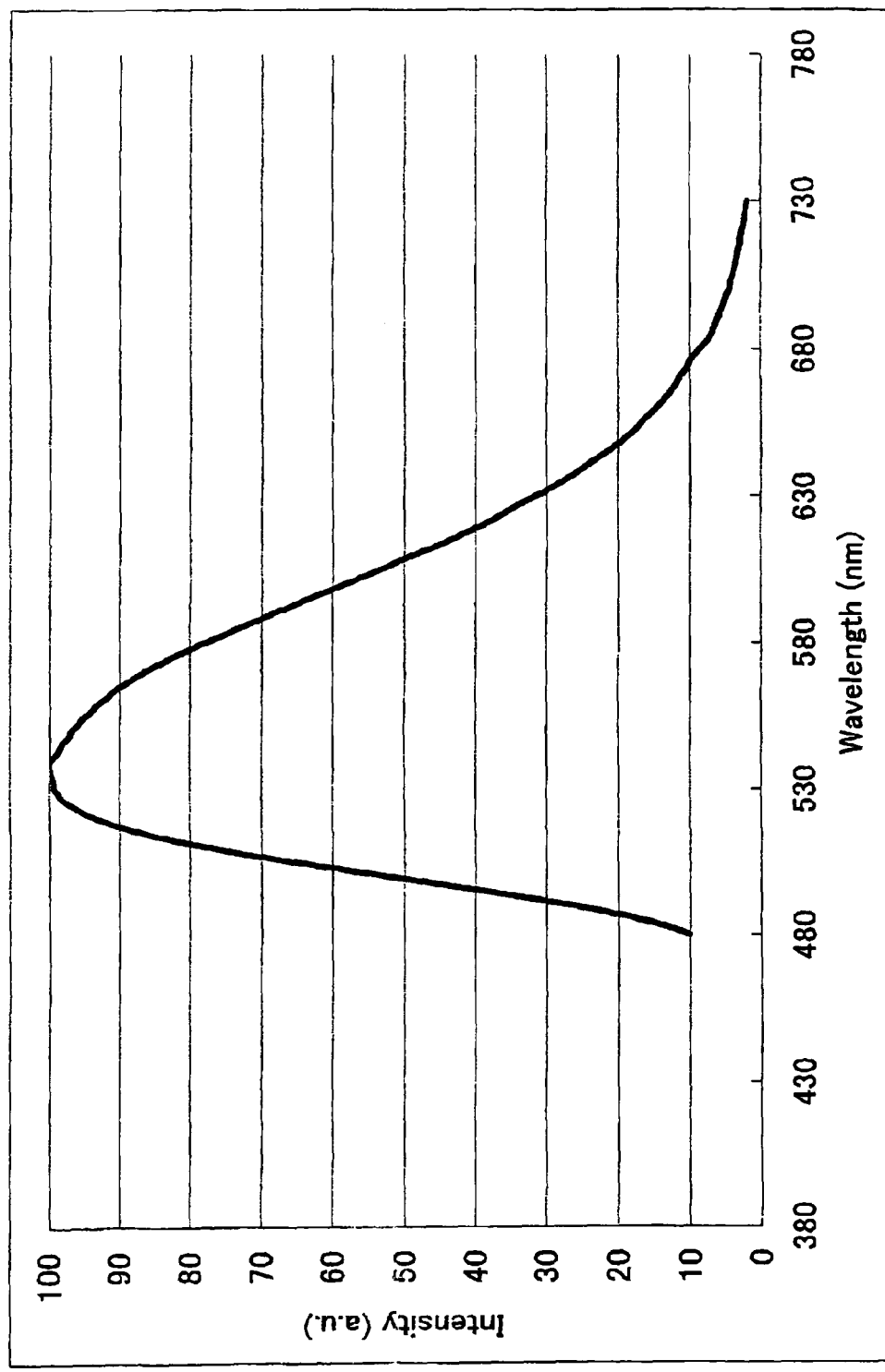
FIG. 8 is an emission spectrum of $Y_3(Al, Ga)_5O_{12}:Ce$ fluorescent material excited with light having wavelength of 450 nm.
Figure 9A:
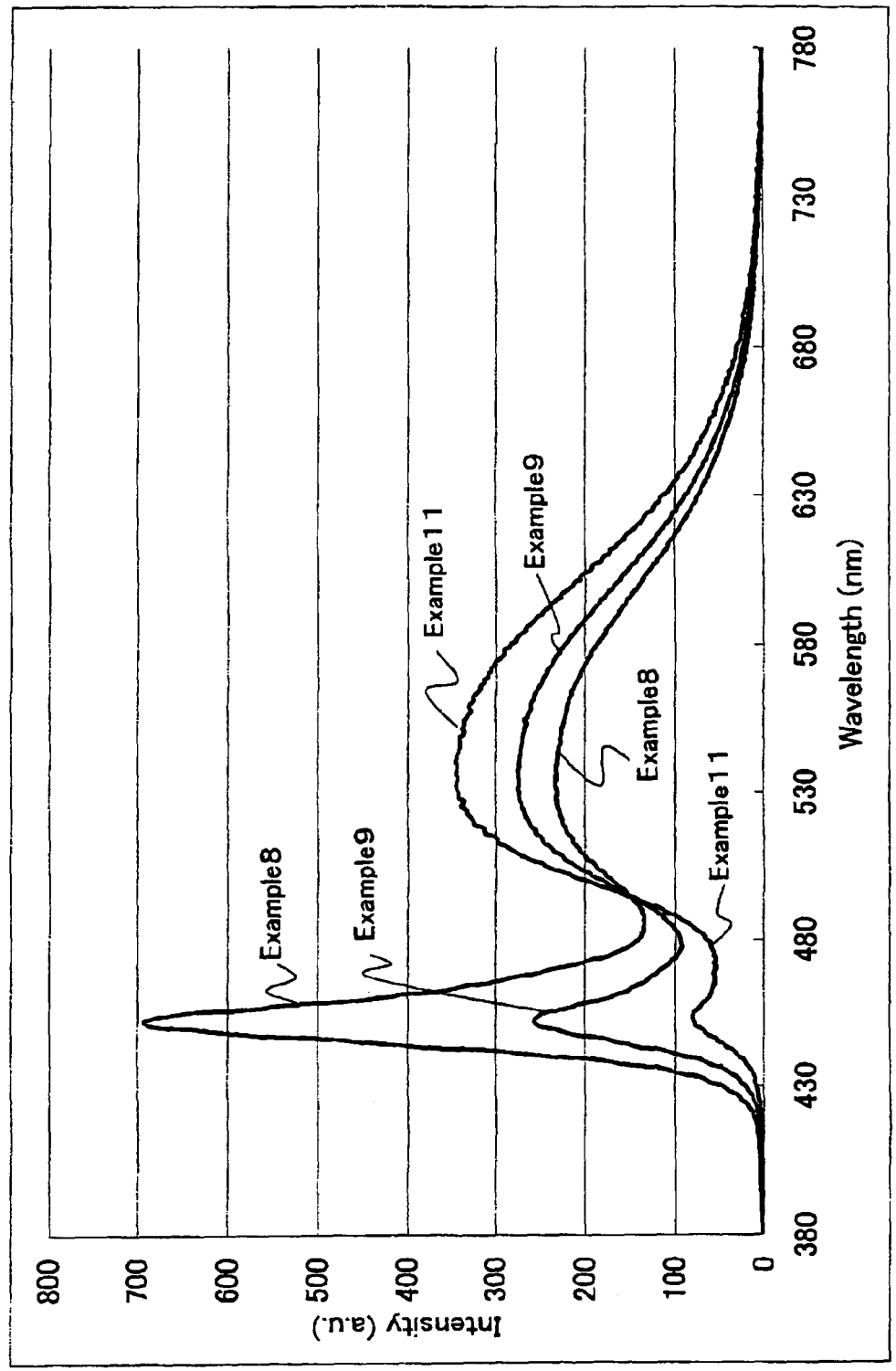
FIGS. 9A and 9B are emission spectra of the light emitting device according to Examples 8 to 12, the emission spectra being measured on the mixed light yet to pass the filter. The fluorescent material was excited by the light emitted by the light emitting element.
Figure 9B:
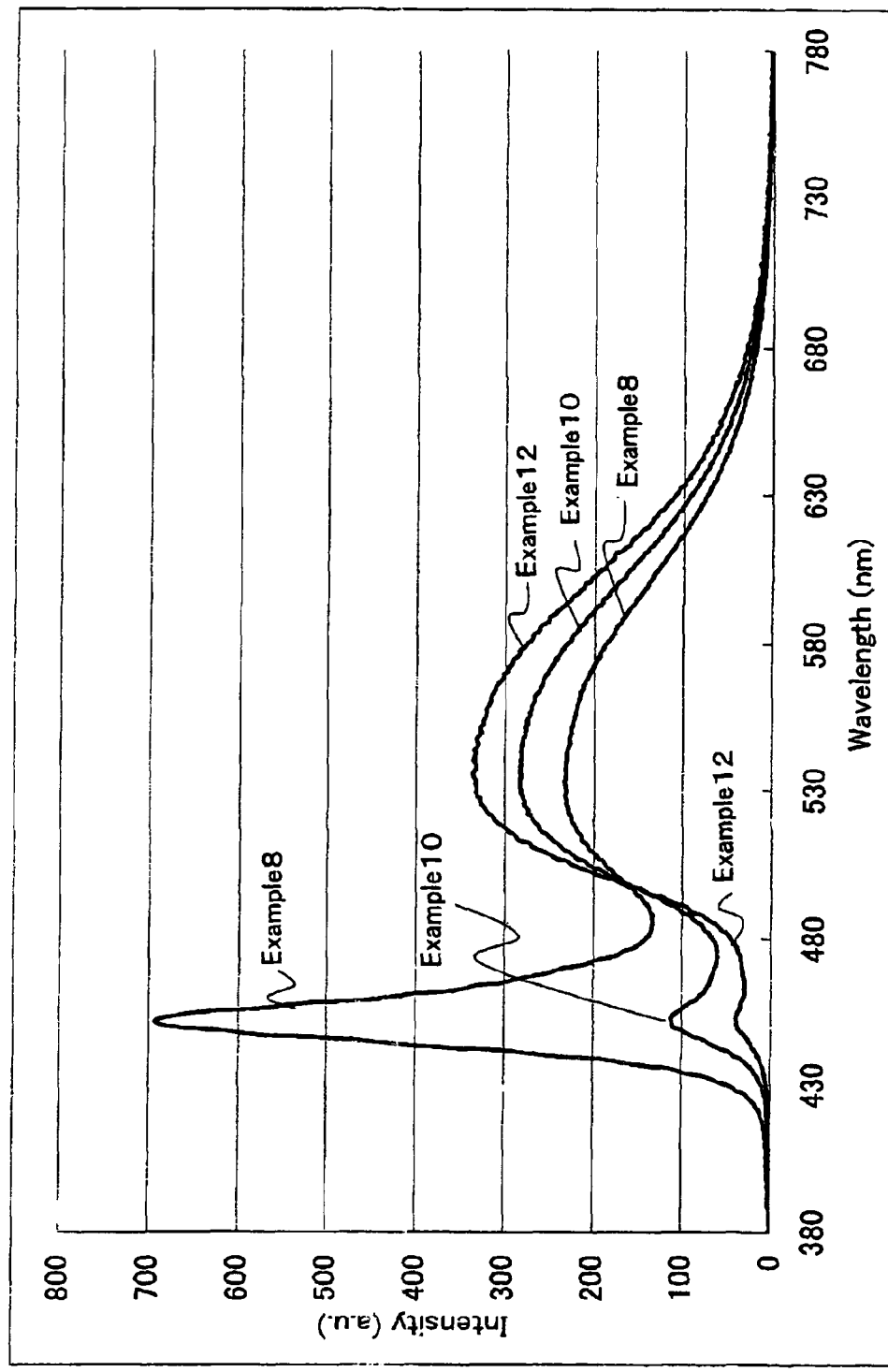
Figure 10:
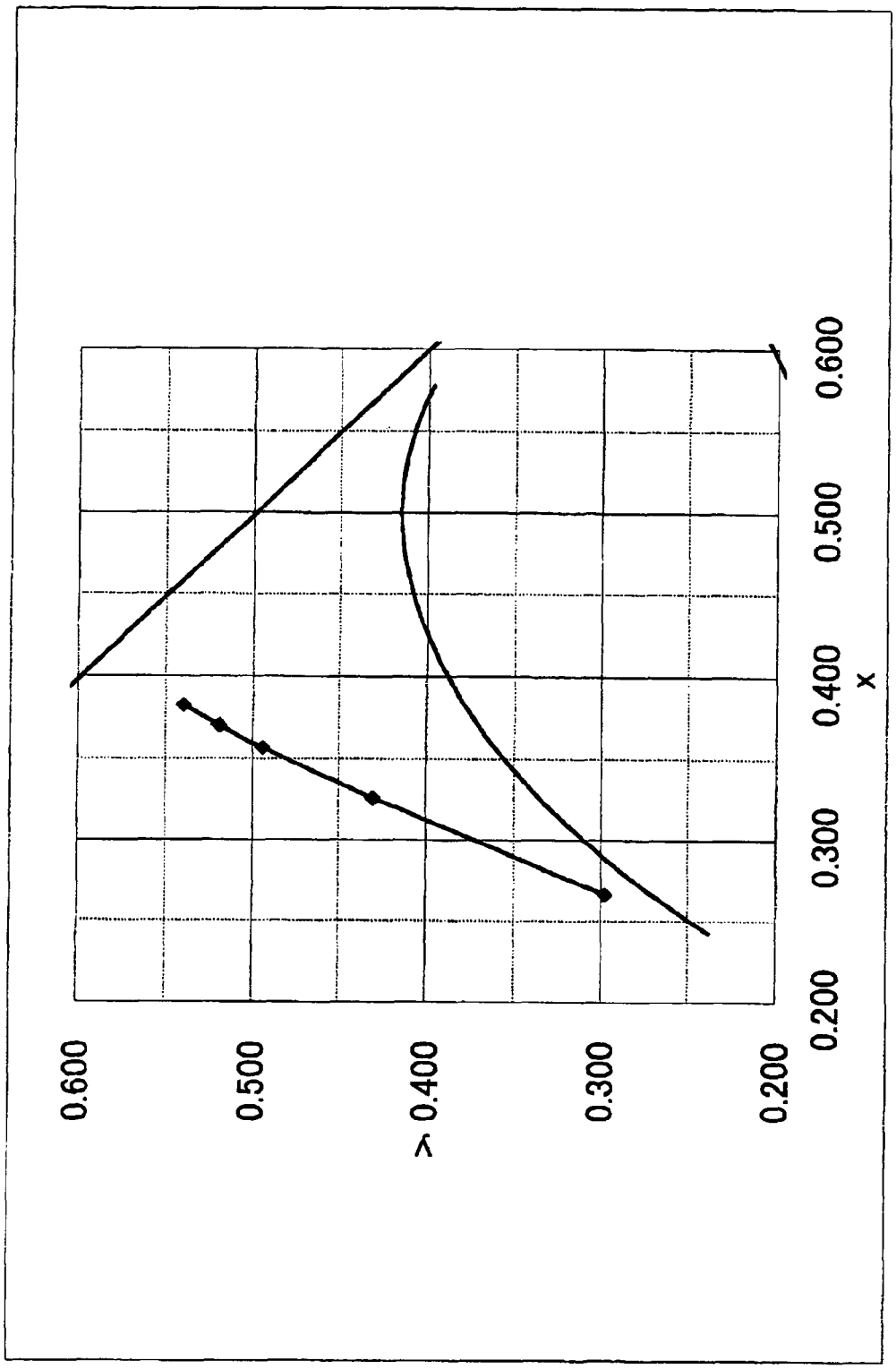
FIG. 10 shows the chromaticity diagram (CIE 1931) in which chromaticity coordinates of the light emitted by the light emitting device according to Examples 8 to 12 are plotted, the color being measured on light emitted by the fluorescent material that was excited by the light emitted by the light emitting element and yet to pass the filter.
Figure 11:
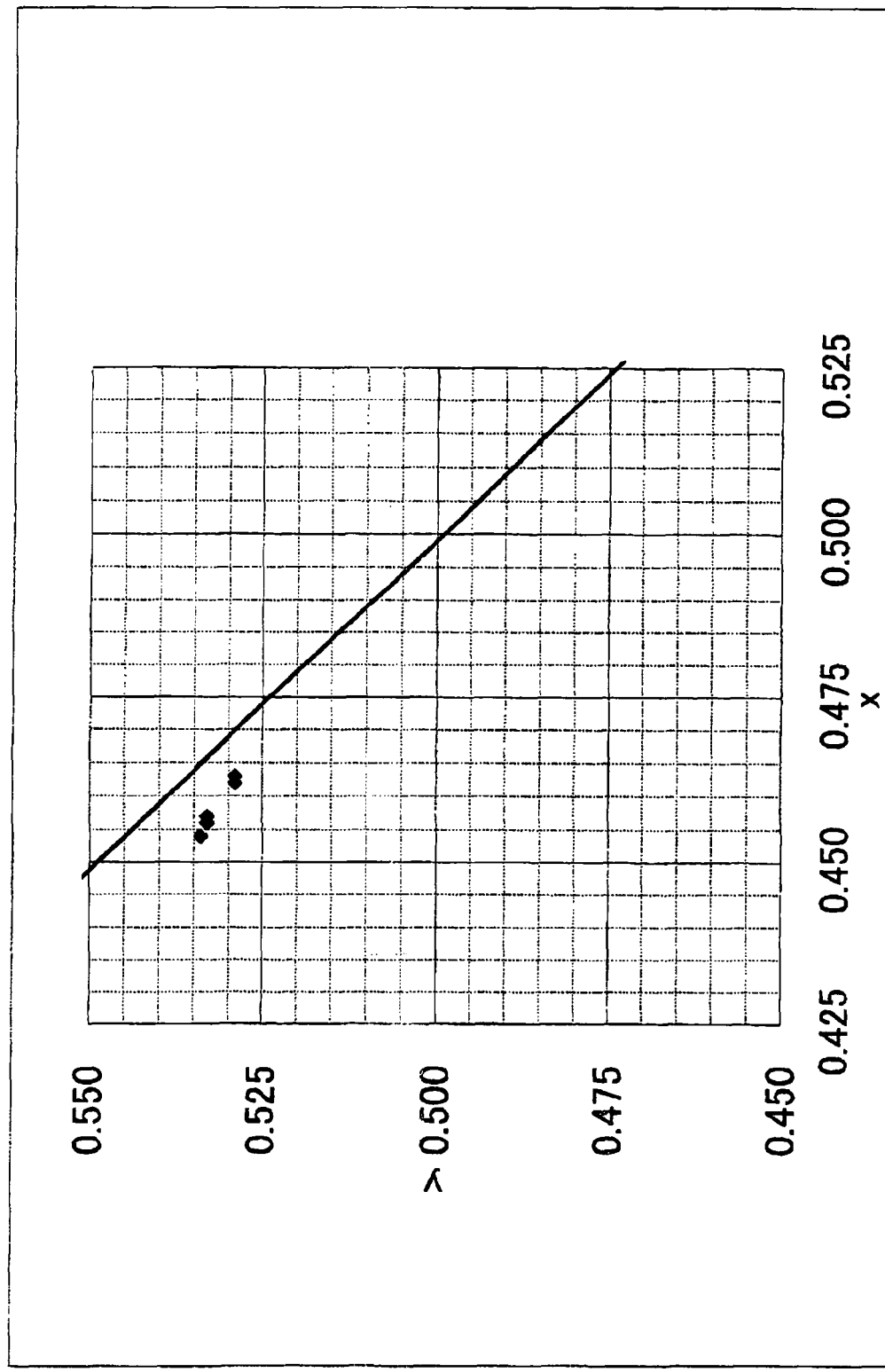
FIG. 11 shows the chromaticity diagram (CIE 1931) in which chromaticity coordinates of the light emitted by the light emitting device according to Examples 8 to 12 and passed the filter are plotted.

The light emitting device according to Examples 8 to 12 will now be described. FIG. 8 shows the emission spectrum of the $Y_3(Al, Ga)_5O_{12}$:Ce fluorescent material excited by light having wavelength of 450 nm. FIGS. 9A and 9B show the emission spectra of the fluorescent material excited by light from the light emitting element according to Examples 8 to 12 (before passing the filter). FIG. 10 shows chromatic coordinates (CIE 1931) of light from the fluorescent material excited by light from the light emitting element according to Examples 8 to 12 (before passing the filter). FIG. 11 shows chromatic coordinates (CIE 1931) of light from the light emitting device according to Examples 8 to 12.

The light emitting device 100 according to Examples 8 to 12 comprises the light emitting element 10, the package 20 having the recess consisting of the bottom surface 20a on which the light emitting element 10 is placed and the side surface 20b extending from the bottom surface 20a, the fluorescent material 50 and the filter (not shown). The light emitting element 10 emits blue light with peak emission wavelength located near 450 nm. The fluorescent material 50 is $Y_3(Al, Ga)_5O_{12}$:Ce fluorescent material. The sealing member 60 is silicone resin. The light emitting device 100 of Example 8 has 10 g of the fluorescent material 50 included in 100 g of the sealing member 60. The light emitting devices 100 of Examples 9 to 12 have 20 g to 50 g of the fluorescent material 50 included in 100 g of the sealing member 60. A predetermined quantity of the sealing member 60 including the fluorescent material 50 is dripped into the recess of the package 20.

Emission characteristic of the light emitting devices 100 when the fluorescent material 50 is excited by the light from the light emitting element 10 according to Examples 8 to 12 are measured. Table 3 shows the emission characteristics when the fluorescent material 50 is excited by the light from the light emitting element 10 according to Examples 8 to 12, measured before the light has passed the filter.

TABLE 3

|  | Amount of fluorescent material | Vf vol [V] | Luminance of light emission Φv [lm] | Chromaticity coordinates | |
|---|---|---|---|---|---|
|  |  |  |  | x | y |
| Example 8 | 10 g | 3.36 | 18.1 | 0.266 | 0.298 |
| Example 9 | 20 g | 3.36 | 20.7 | 0.326 | 0.430 |
| Example 10 | 30 g | 3.36 | 21.2 | 0.357 | 0.494 |
| Example 11 | 40 g | 3.38 | 19.1 | 0.371 | 0.520 |
| Example 12 | 50 g | 3.38 | 18.5 | 0.383 | 0.540 |

| | Emission spectrum | | |
|---|---|---|---|
| | LED Peak wavelength (nm) | Fluorescent material Peak wavelength (nm) | Ratio in intensity of component Fluorescent material/LED |
| Example 8 | 452 | 533 | 0.3 |
| Example 9 | 452 | 537 | 1.1 |
| Example 10 | 453 | 531 | 2.5 |
| Example 11 | 453 | 540 | 4.3 |
| Example 12 | 443 | 535 | 8.6 |

These results show that colors of light from the light emitting devices according to Examples 8 to 12 before passing the filter lie on a substantially straight line connecting two points having chromaticity coordinates of x=0.266, y=0.298 and x=0.383, y=0.540. The light emitting device 100 of Example 8 emits light of white color with a little blue tinge. Yellow-color light component gradually increases from Example 8 to Example 12, so that the light emitting device 100 of Example 12 emits light with yellowish green color. The ratio in intensity of the component pf peak emission wavelength of the fluorescent material 50 to the component of peak emission wavelength of the light emitting element 10 gradually increases from 0.3 in Example 8 to 8.6 in Example 12. This means that, as the quantity of the fluorescent material 50 increases, intensity of light which is emitted by the light emitting element 10 and passes between the particles of the fluorescent material 50 so as to emerge from the light emitting device 100 decreases.

Emission characteristics of the light emitting devices 100 according to Examples 8 to 12 are measured. Table 4 shows the emission characteristic of the light emitting device 100 according to Examples 9 to 12, measured after the light has passed the filter. Luminance values of emission of the light emitting device 100 according to Examples 9 to 12 are given in terms of percentage relative to that of the light emitting device 100 of Example 8.

TABLE 4

| | Amount of fluorescent material | Chromaticity coordinates | | Luminance emission |
|---|---|---|---|---|
| | | x | y | (%) |
| Example 8 | 10 g | 0.454 | 0.534 | 100 |
| Example 9 | 20 g | 0.456 | 0.533 | 118 |
| Example 10 | 30 g | 0.457 | 0.533 | 123 |
| Example 11 | 40 g | 0.462 | 0.529 | 149 |
| Example 12 | 50 g | 0.463 | 0.529 | 145 |

These results show that the values of chromaticity coordinates of the light from the light emitting device 100 remain substantially constant regardless of changes in the content of the fluorescent material 50 included in the sealing member 60. Luminance of emission, in contrast, increases gradually from Example 8 to Example 11, and decreases gradually from Example 1 to Example 12. Luminance of emission reaches a peak in Example 11.

Table 3 and Table 4 show that light, obtained by exciting the $Y_3(Al, Ga)_5O_{12}$:Ce fluorescent material by using a light emitting element having a peak emission wavelength at 450 nm and passing the light through a filter which cuts off light of wavelengths shorter than 480 nm, has substantially constant color with chromaticity coordinates in ranges of x=0.454 to 0.463 and y=0.529 to 0.534. Luminance of emission of light emitted by the light emitting device after passing the filter becomes highest when the ratio in intensity of the component having a peak emission wavelength of the fluorescent material to the component having a peak emission wavelength of the light emitting element is 4.3. This means that higher luminance cannot be achieved simply by decreasing the intensity of light emitted by the light emitting element which serves as the exciting light source.

The luminance of light emission can be decreased while keeping the color constant by either decreasing or increasing the content of the fluorescent material 50. When the content of the fluorescent material 50 is decreased, it is made possible to manufacture the light emitting device 100 at a lower cost. When the content of the fluorescent material 50 is increased, it is made possible to reduce the heat accumulated in the filter.

EXAMPLES 13 TO 22

Figure 12:
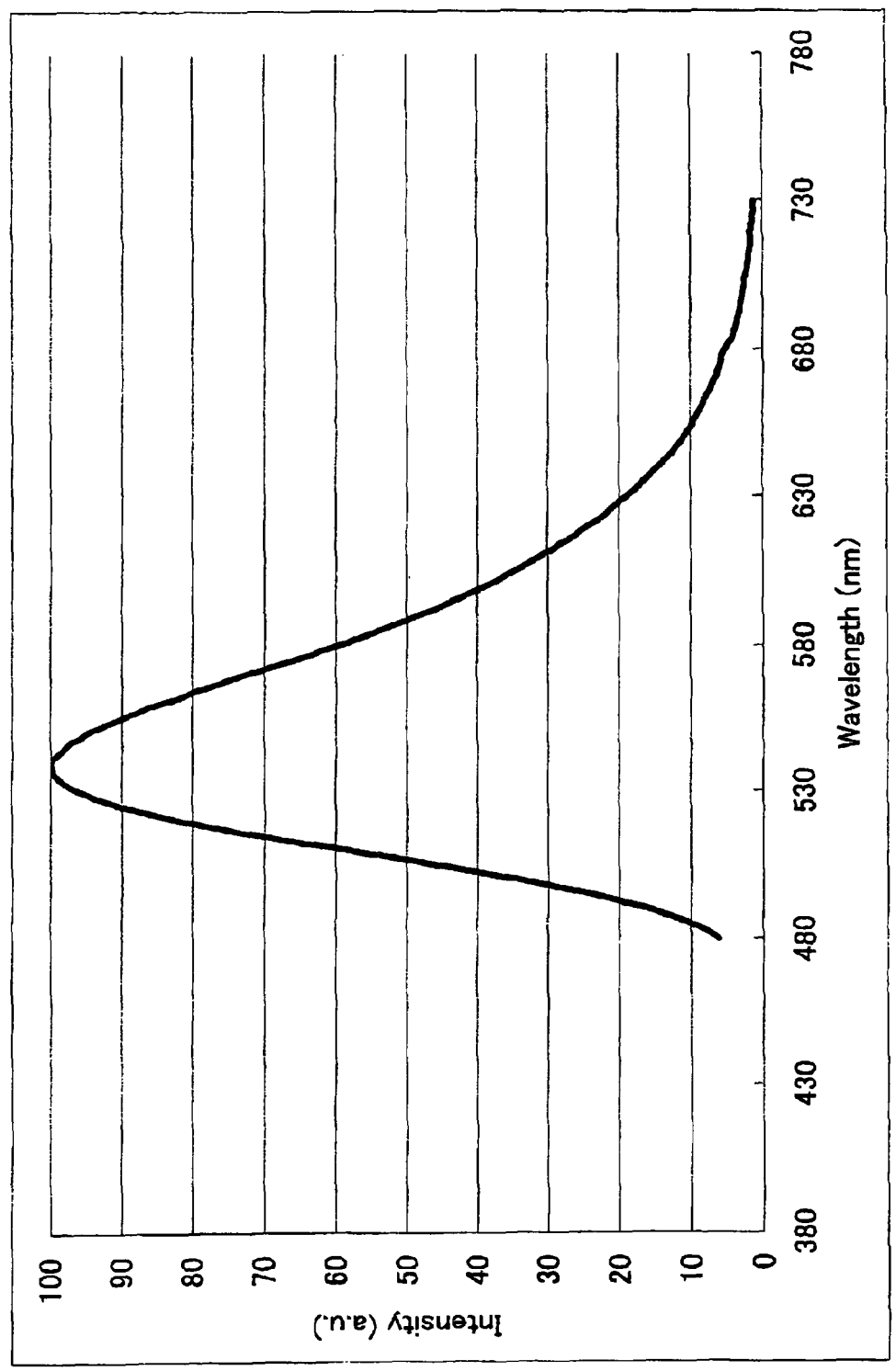
FIG. 12 is an emission spectrum of $Sr_5Si_3O_{11}:Eu$ fluorescent material excited with light having wavelength of 450 nm.
Figure 13A:
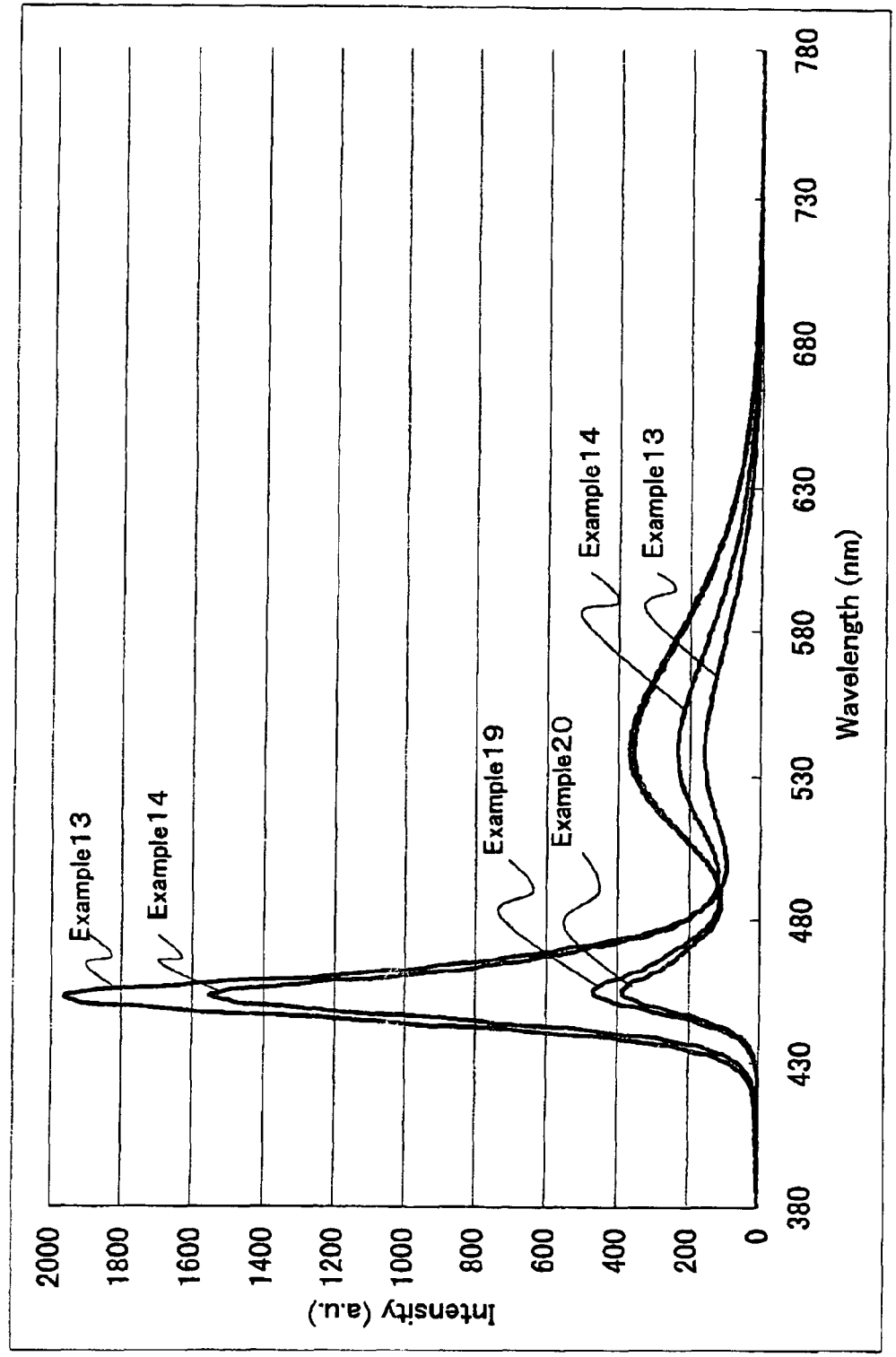
FIGS. 13A to 13C are emission spectra of the light emitting device according to Examples 13 to 22, the emission spectra being measured on the mixed light yet to pass the filter. The fluorescent material was excited by the light emitted by the light emitting element.
Figure 13B:
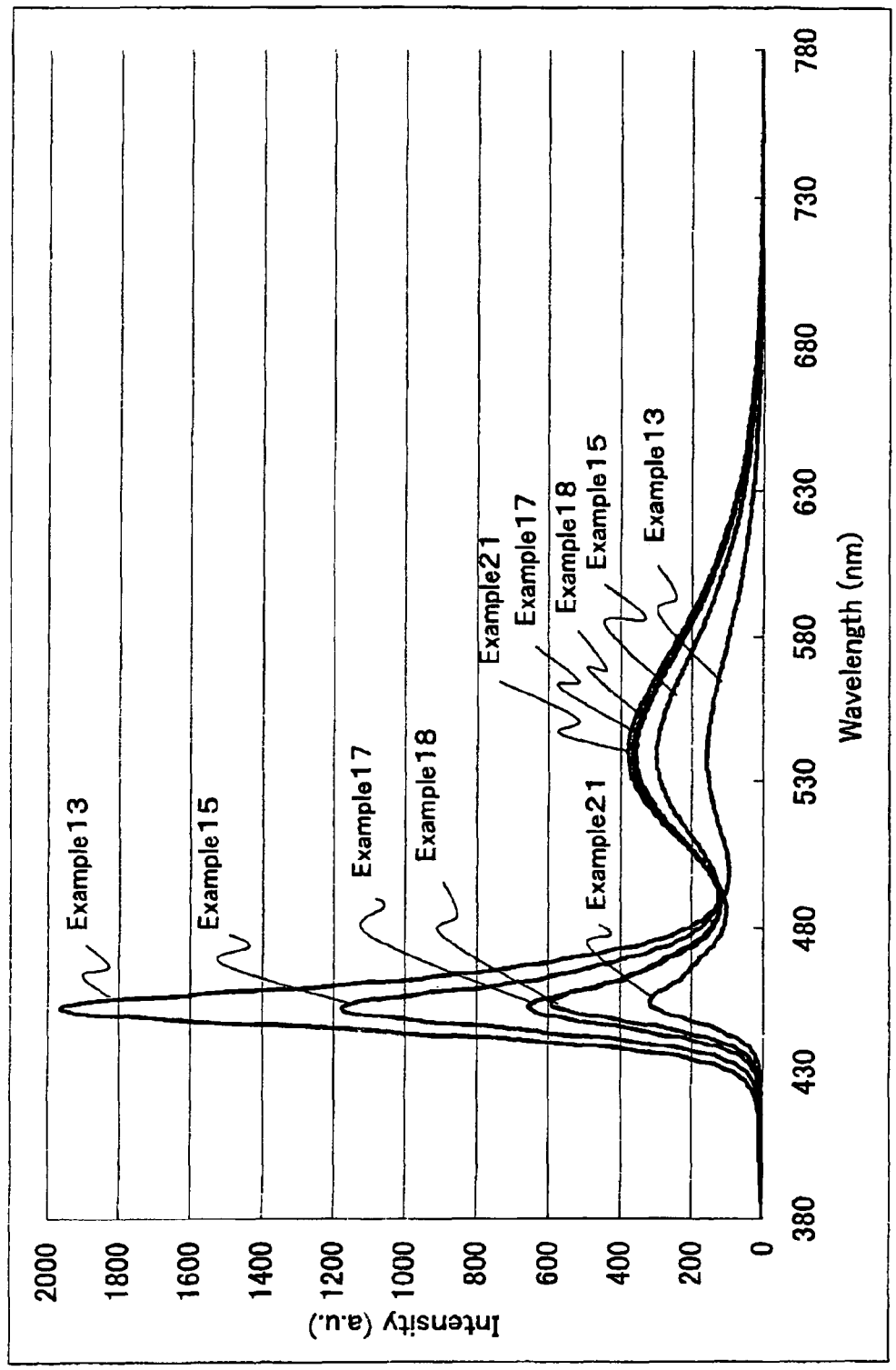
Figure 13C:
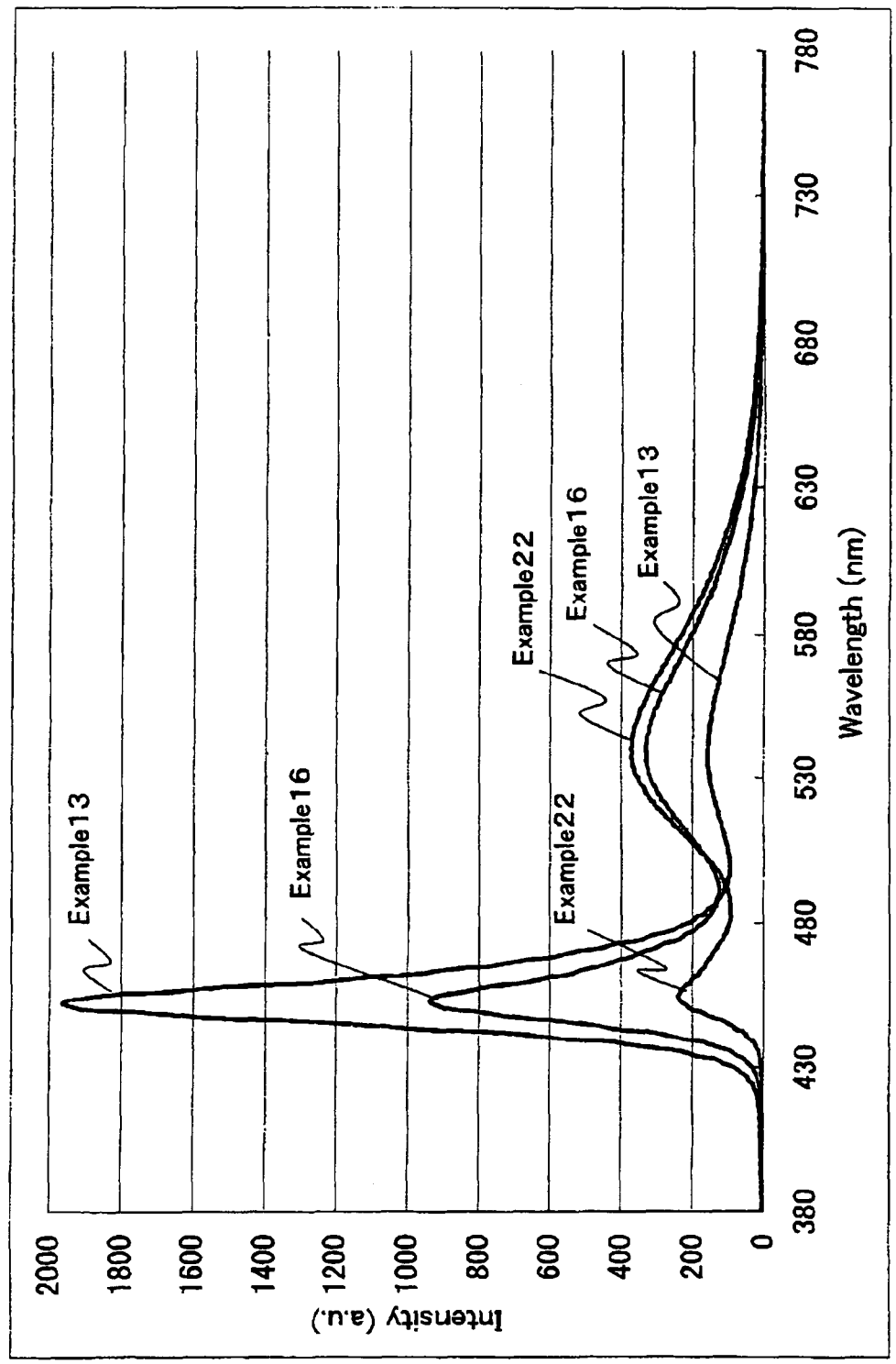
Figure 14:
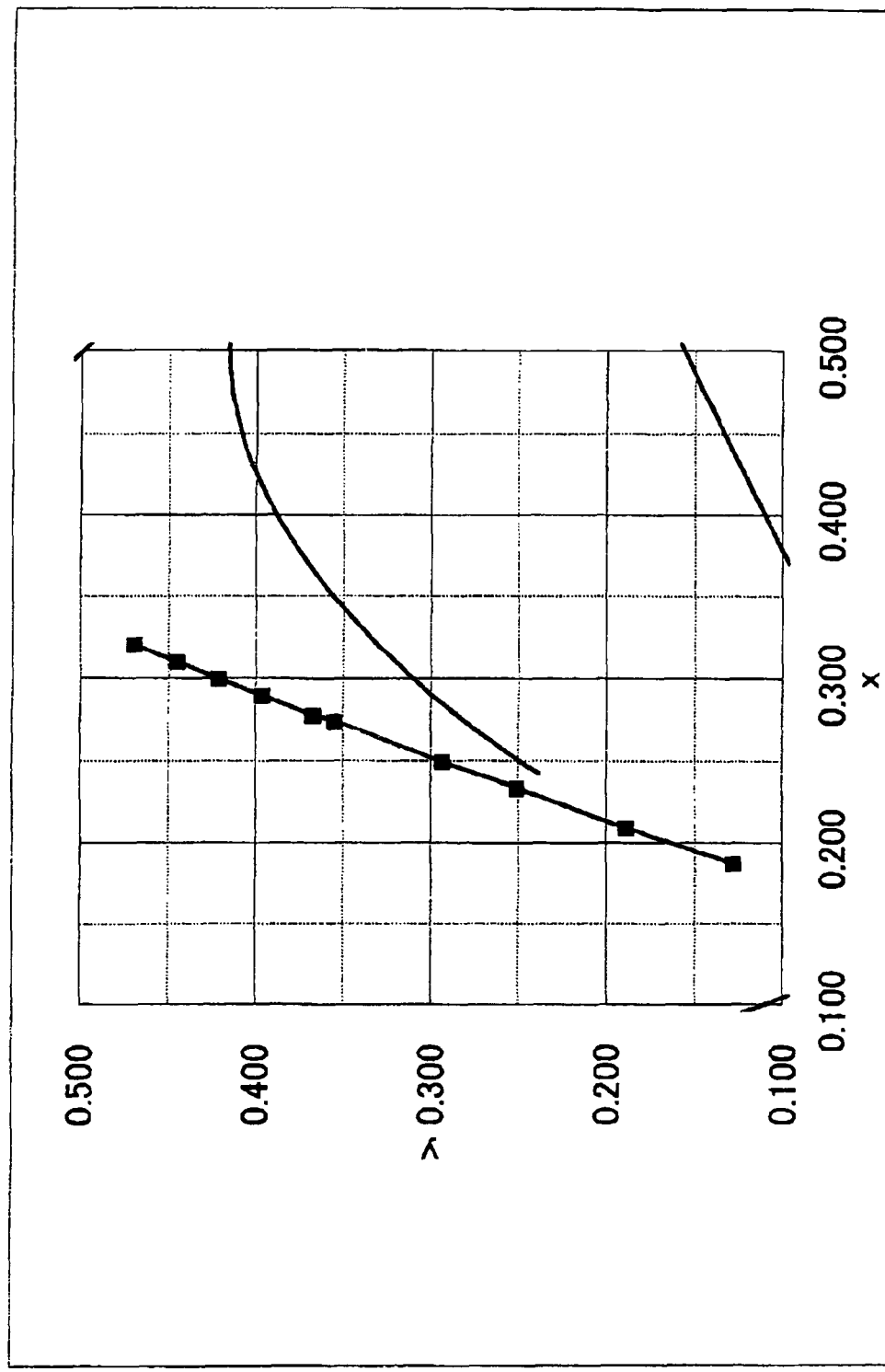
FIG. 14 shows the chromaticity diagram (CIE 1931) in which chromaticity coordinates of the light emitted by the light emitting device according to Examples 13 to 22 are plotted, the color being measured on light emitted by the fluorescent material that was excited by the light emitted by the light emitting element and yet to pass the filter.
Figure 15:
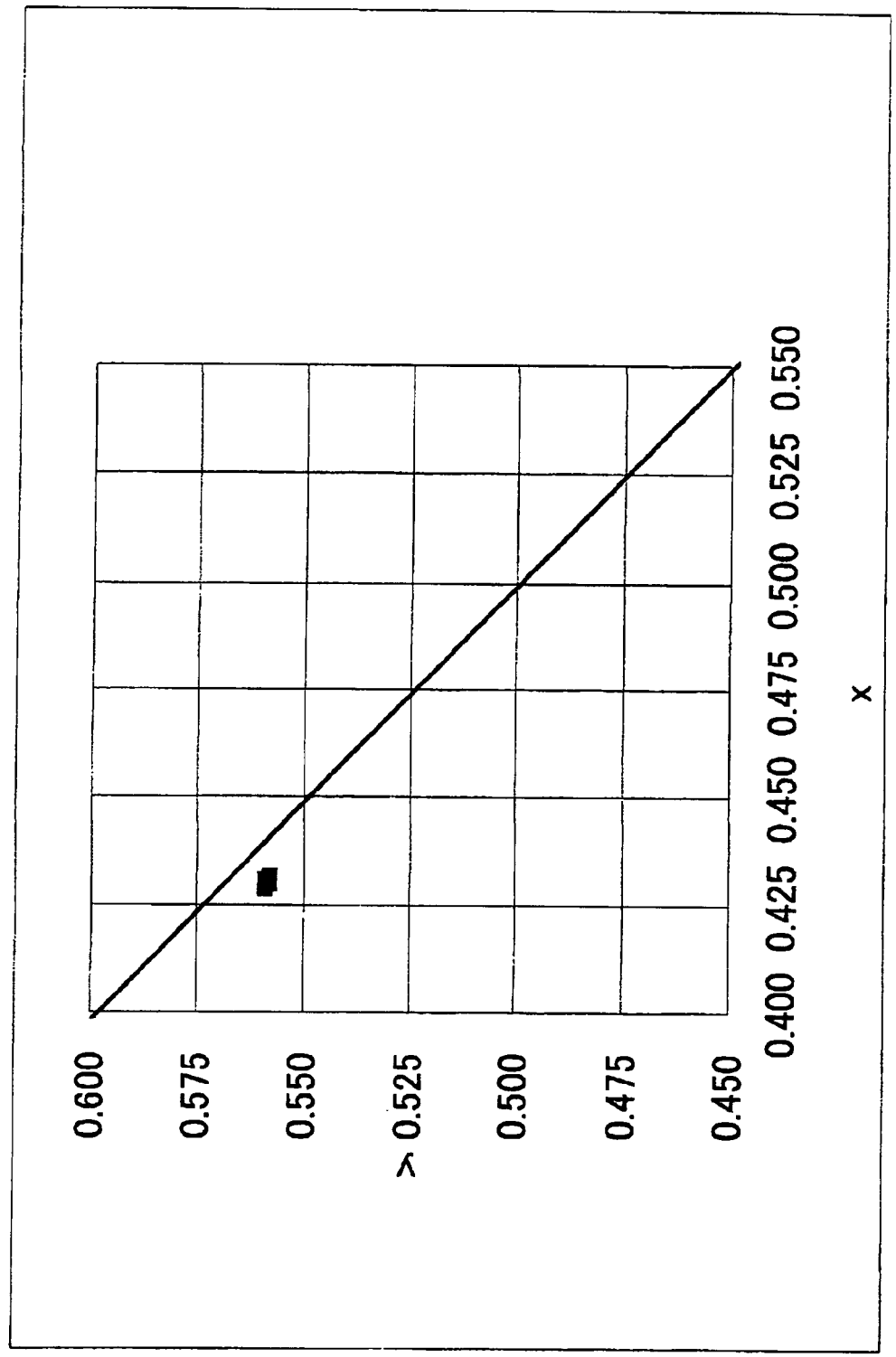
FIG. 15 shows the chromaticity diagram (CIE 1931) in which chromaticity coordinates of the light emitted by the light emitting device according to Examples 13 to 22 and passed the filter are plotted.

The light emitting devices according to Examples 13 to 22 will now be described. FIG. 12 shows the emission spectrum of the $Sr_5Si_3O_{11}$:Eu fluorescent material excited with light having wavelength of 450 nm. FIGS. 13A to 13C show the emission spectra of the fluorescent material excited with light from the light emitting elements according to Examples 13 to 22 (before passing the filter). FIG. 14 shows chromatic coordinates (CIE 1931) of light from the fluorescent material excited by light from the light emitting element according to Examples 13 to 22 (before passing the filter). FIG. 15 shows chromatic coordinates (CIE 1931) of light from the light emitting device according to Examples 13 to 22.

The light emitting device 100 according to Examples 13 to 22 comprises the light emitting element 10, the package 20 having the recess consisting of the bottom surface 20a on which the light emitting element 10 is placed and the side surface 20b extending from the bottom surface 20a, the fluorescent material 50 and the filter (not shown). The light emitting element 10 emits blue light with peak emission wavelength located near 450 nm. The fluorescent material 50 is the $Sr_5Si_3O_{11}$:Eu fluorescent material. The sealing member 60 is silicone resin. The light emitting device 100 of Example 13 has 10 g of the fluorescent material 50 included in 100 g of the sealing member 60. The light emitting devices 100 of Examples 14 to 22 have 20 g to 100 g of the fluorescent material 50 included in 100 g of the sealing member 60. A predetermined quantity of the sealing member 60 including the fluorescent material 50 is dripped into the recess of the package 20.

Emission characteristic of the light emitting devices 100 when the fluorescent material 50 is excited by the light from the light emitting element 10 according to Examples 13 to 22 are measured. Table 5 shows the emission characteristics when the fluorescent material 50 is excited with the light from the light emitting element 10 according to Examples 13 to 22, measured after the light has passed the filter.

TABLE 5

|  | Amount of fluorescent material | Vf vol [V] | Luminance of light emission Φv [lm] | Chromaticity coordinates | |
|---|---|---|---|---|---|
|  |  |  |  | x | y |
| Example 13 | 10 g | 3.39 | 9.1 | 0.187 | 0.128 |
| Example 14 | 20 g | 3.39 | 12.3 | 0.209 | 0.189 |
| Example 15 | 30 g | 3.37 | 15.1 | 0.234 | 0.250 |
| Example 16 | 40 g | 3.38 | 16.4 | 0.250 | 0.294 |
| Example 17 | 50 g | 3.37 | 17.7 | 0.274 | 0.354 |
| Example 18 | 60 g | 3.38 | 17.3 | 0.278 | 0.367 |
| Example 19 | 70 g | 3.37 | 17.3 | 0.290 | 0.396 |
| Example 20 | 80 g | 3.38 | 17.7 | 0.300 | 0.421 |
| Example 21 | 90 g | 3.37 | 18.1 | 0.310 | 0.445 |
| Example 22 | 100 g | 3.38 | 17.7 | 0.320 | 0.469 |

Emission spectrum

|  | LED Peak wavelength (nm) | Fluorescent material Peak wavelength (nm) | Ratio in intensity of component Fluorescent material/LED |
|---|---|---|---|
| Example 13 | 452 | 539 | 0.1 |
| Example 14 | 453 | 538 | 0.1 |
| Example 15 | 452 | 542 | 0.3 |
| Example 16 | 453 | 541 | 0.4 |
| Example 17 | 443 | 542 | 0.6 |
| Example 18 | 454 | 540 | 0.6 |
| Example 19 | 455 | 539 | 0.8 |
| Example 20 | 455 | 538 | 1.0 |
| Example 21 | 455 | 540 | 1.2 |
| Example 22 | 455 | 540 | 1.6 |

These results show that colors of light from the light emitting device according to Examples 13 to 22 before passing the filter lie on a substantially straight line connecting two points of chromaticity coordinates x=0.187, y=0.128 and x=0.320, y=0.469. The light emitting device 100 of Example 13 emits blue light. Yellow-color light component gradually increases from Example 14 to Example 22, so that the light emitting device 100 of Example 22 emits white light with yellowish tinge. The ratio in intensity of component of peak emission wavelength of the fluorescent material 50 to the peak emission wavelength of the light emitting element 10 gradually increases from 0.1 in Example 13 to 1.6 in Example 22. This means that, as the content of the fluorescent material 50 increases, intensity of light which is emitted by the light emitting element 10 and passes between the particles of the fluorescent material 50 so as to emerge from the light emitting device 100 decreases.

Then emission characteristics of the light emitting device 100 according to Examples 13 to 22 are measured. Table 6 shows the emission characteristic of the light emitting device 100 according to Examples 13 to 22, measured after the light has passed the filter. Luminance values of emission of the light emitting device 100 according to Examples 9 to 12 are given in terms of percentage relative to that of the light emitting device 100 of Example 13.

TABLE 6

|  | Amount of fluorescent material | Chromaticity coordinates | | Luminance emission (%) |
|---|---|---|---|---|
|  |  | x | y |  |
| Example 13 | 10 g | 0.429 | 0.559 | 100 |
| Example 14 | 20 g | 0.430 | 0.558 | 147 |

TABLE 6-continued

|  | Amount of fluorescent material | Chromaticity coordinates | | Luminance emission (%) |
|---|---|---|---|---|
|  |  | x | y |  |
| Example 15 | 30 g | 0.431 | 0.558 | 189 |
| Example 16 | 40 g | 0.431 | 0.558 | 209 |
| Example 17 | 50 g | 0.432 | 0.558 | 231 |
| Example 18 | 60 g | 0.431 | 0.559 | 226 |
| Example 19 | 70 g | 0.431 | 0.559 | 227 |
| Example 20 | 80 g | 0.431 | 0.559 | 234 |
| Example 21 | 90 g | 0.432 | 0.558 | 240 |
| Example 22 | 100 g | 0.432 | 0.558 | 237 |

These results show that the values of chromaticity coordinates of the light from the light emitting device 100 remain substantially constant regardless of changes in the content of the fluorescent material 50 included in the sealing member 60. Luminance of emission, in contrast, increases gradually from Example 13 and becomes the highest with Example 21.

Table 5 and Table 6 show that light, obtained by exciting the $Sr_5Si_3O_{11}$:Eu fluorescent material by using a light emitting element having a peak emission wavelength at 455 nm and passing the light through a filter which cuts off light of wavelengths shorter than 480 nm, has substantially constant color with chromaticity coordinates in ranges of x=0.429 to 0.432 and y=0.558 to 0.559. Luminance of light emitted by the light emitting device after passing the filter reaches a peak when the ratio in intensity of the component having a peak emission wavelength of the fluorescent material to the component having a peak emission wavelength of the light emitting element is 1.2. This means that higher luminance cannot be achieved simply by decreasing the intensity of light emitted by the light emitting element which serves as the exciting light source.

The luminance of light emission can be decreased while keeping the color constant by using a slight amount of the fluorescent material 50 or an excessive amount of the fluorescent material 50. When the content of the fluorescent material 50 is decreased, it is made possible to manufacture the light emitting device 100 at a lower cost. When the content of the fluorescent material 50 is increased, it is made possible to reduce the heat accumulated in the filter.

EXAMPLES 23 TO 29

Figure 16:
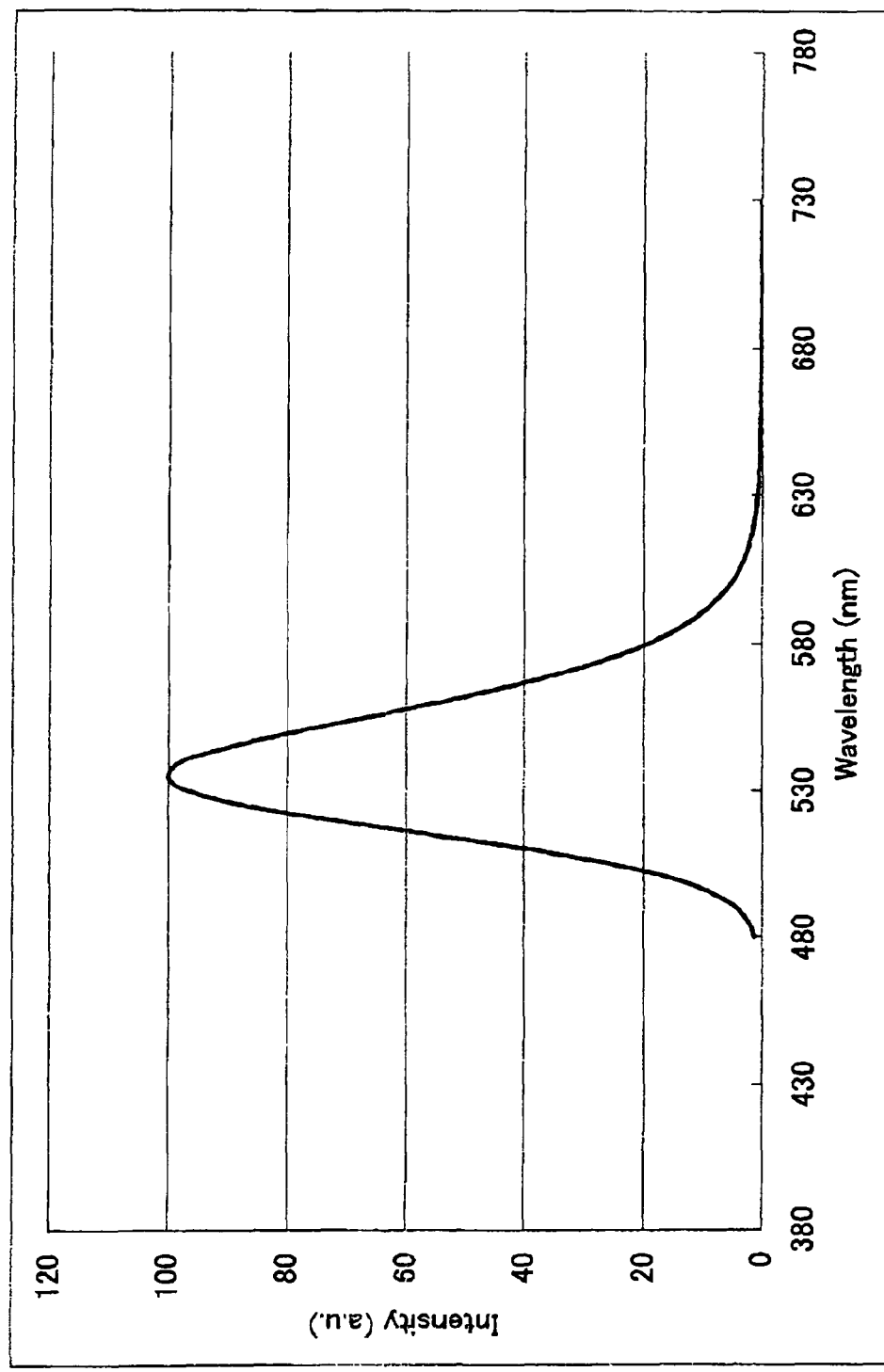
FIG. 16 is an emission spectrum of $SrGa_2S_4:Eu$ fluorescent material excited with light having wavelength of 450 nm.
Figure 17A:
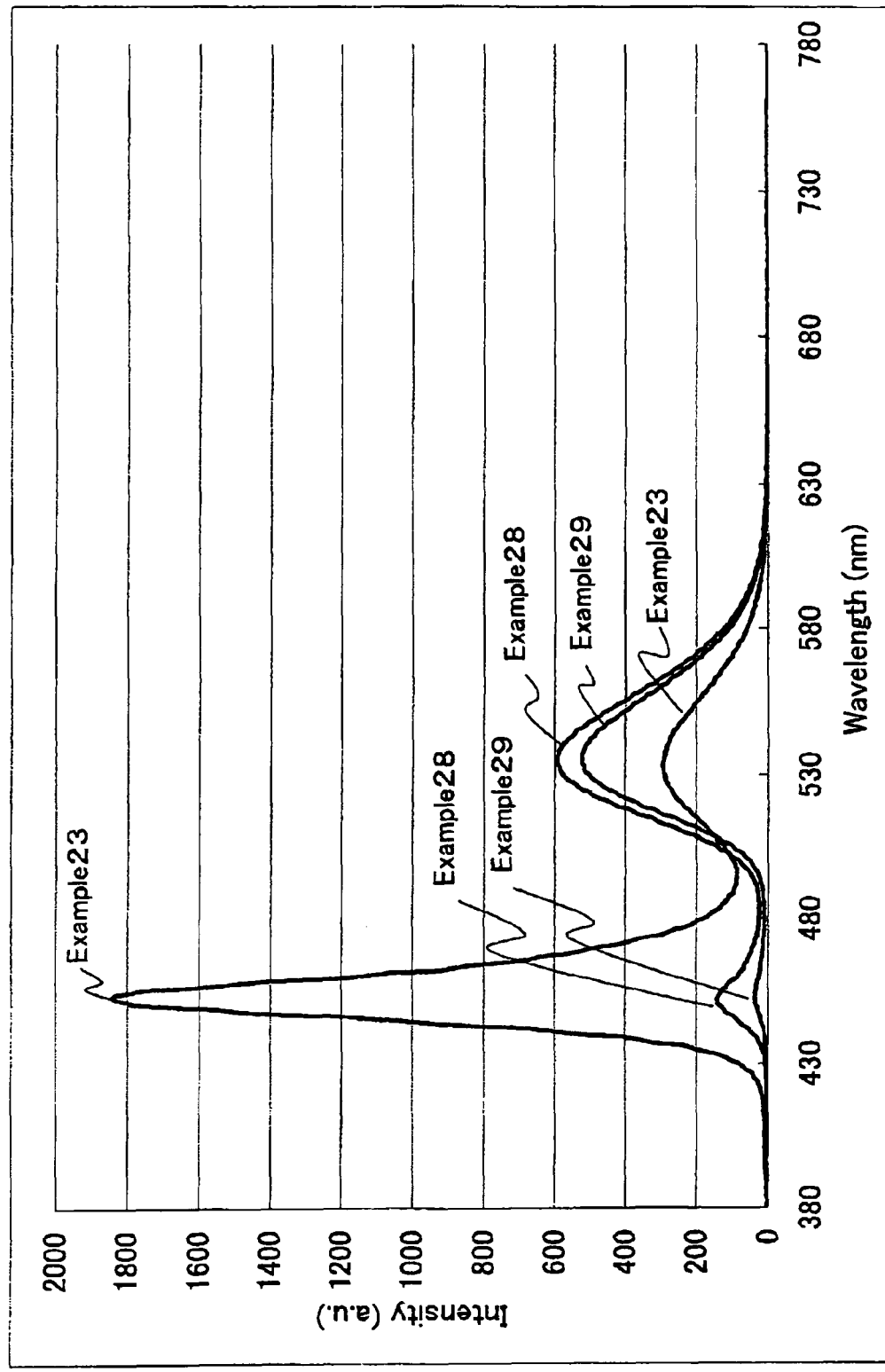
FIGS. 17A and 17B are emission spectra of the light emitting device according to Examples 23 to 29, the emission spectra being measured on the mixed light yet to pass the filter. The fluorescent material was excited by the light emitted by the light emitting element.
Figure 17B:
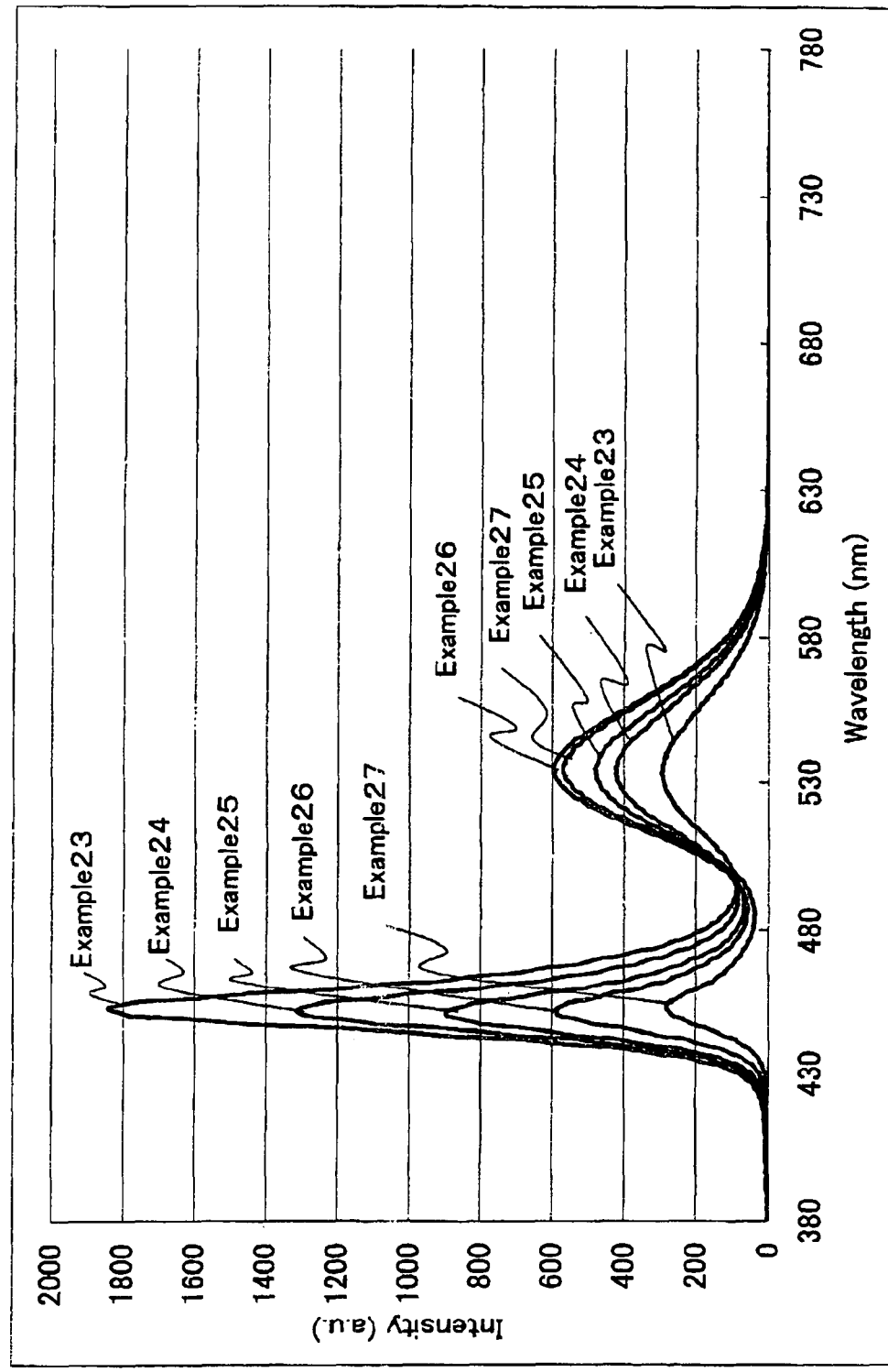
Figure 18:
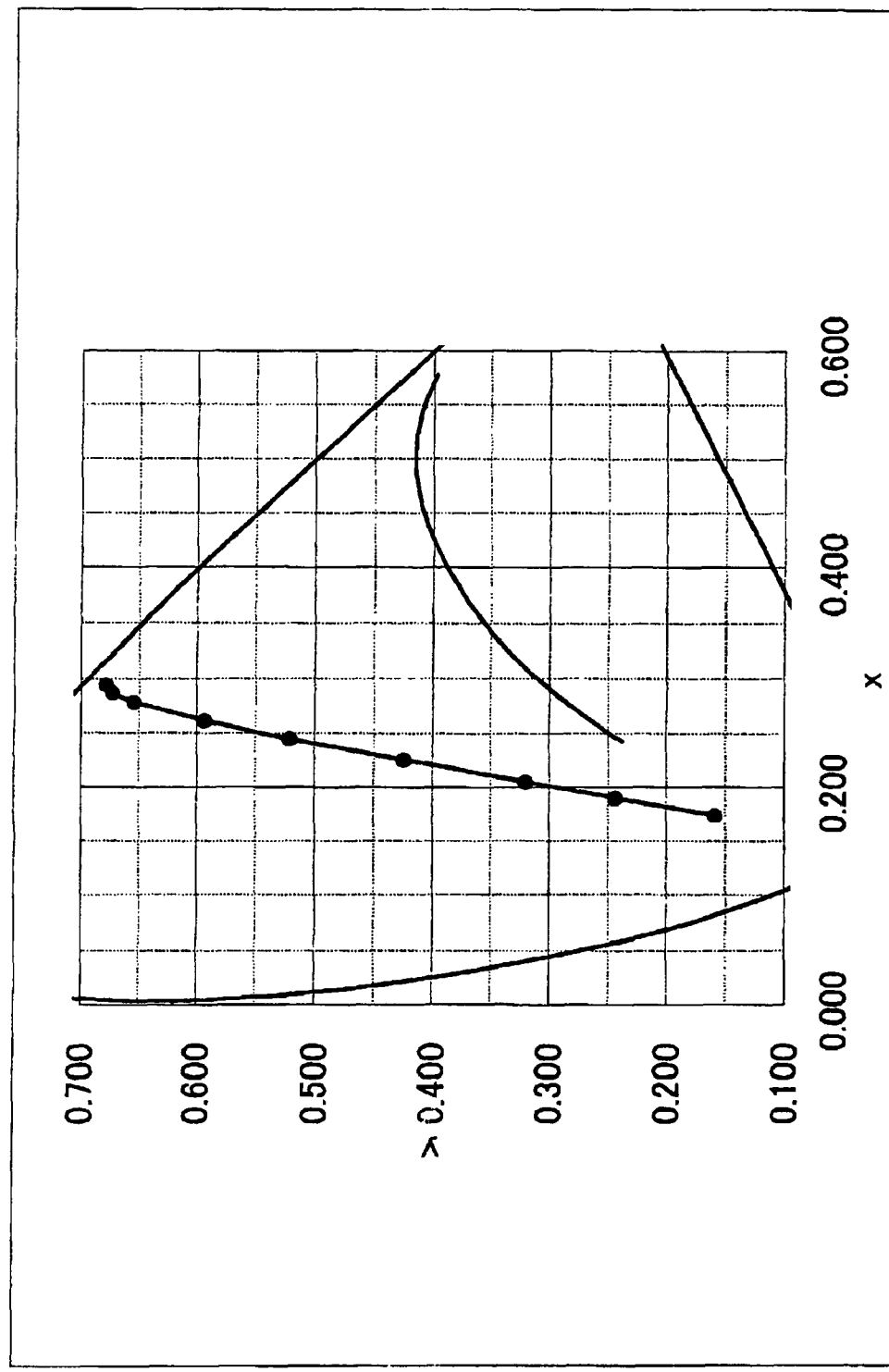
FIG. 18 shows the chromaticity diagram (CIE 1931) in which chromaticity coordinates of the light emitted by the light emitting device according to Examples 23 to 29 are plotted, the color being measured on light emitted by the fluorescent material that was excited by the light emitted by the light emitting element and yet to pass the filter.
Figure 19:
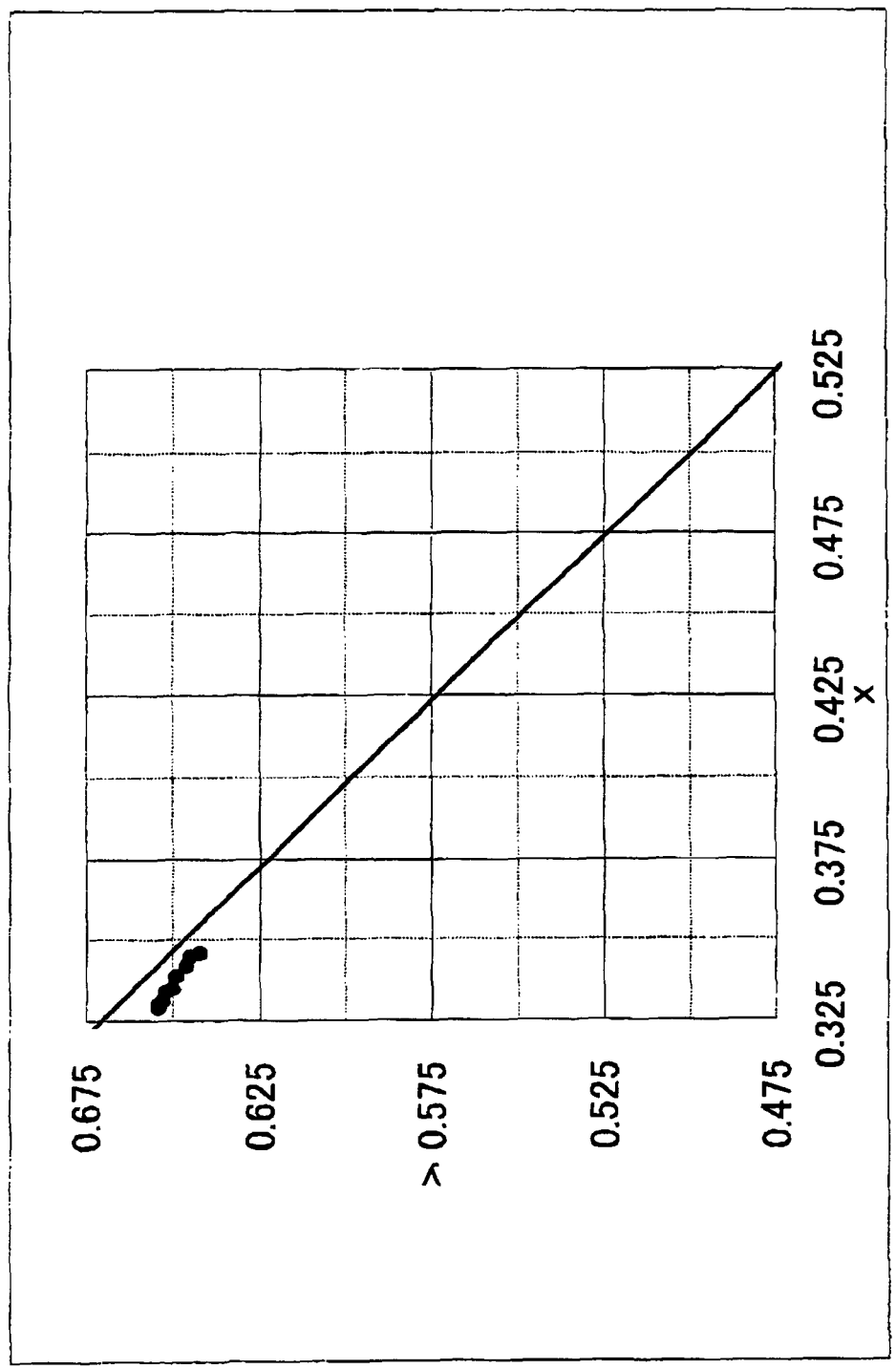
FIG. 19 shows the chromaticity diagram (CIE 1931) in which chromaticity coordinates of the light emitted by the light emitting device according to Examples 23 to 29 and passed the filter are plotted.

The light emitting device according to Examples 23 to 29 will now be described. FIG. 16 shows the emission spectrum of the $SrGa_2S_4$:Eu fluorescent material excited with light of wavelength 450 nm. FIGS. 17A and 17B show the emission spectra of the fluorescent materials excited by light from the light emitting element according to Examples 23 to 29 (before passing the filter). FIG. 18 shows chromaticity coordinates (CIE 1931) of light from the fluorescent material excited by light from the light emitting elements according to Examples 23 to 29 (before passing the filter). FIG. 19 shows chromaticity coordinates (CIE 1931) of light from the light emitting devices according to Examples 23 to 29.

The light emitting device 100 according to Examples 23 to 29 comprises the light emitting element 10, the package 20 having the recess consisting of the bottom surface 20a on which the light emitting element 10 is placed and the side surface 20b extending from the bottom surface 20a, the fluorescent material 50 and the filter (not shown). The light emitting element 10 emits blue light with peak emission wavelength located near 453 nm. The fluorescent material 50 is the SrGa$_2$S$_4$:Eu fluorescent material. The sealing member 60 is silicone resin. The light emitting device 100 of Example 23 has 2.5 g of the fluorescent material 50 included in 100 g of the sealing member 60. The light emitting devices 100 of Examples 24 to 29 have 5 g to 30 g of the fluorescent material 50 included in 100 g of the sealing member 60. A predetermined quantity of the sealing member 60 including the fluorescent material 50 is dripped into the recess of the package 20.

Emission characteristics of the light emitting devices 100 when the fluorescent material 50 is excited by the light from the light emitting element 10 according to Examples 23 to 29 are measured. Table 7 shows the emission characteristics when the fluorescent material 50 is excited by the light from the light emitting element 10 according to Examples 23 to 29, measured before the light has passed the filter.

TABLE 7

| | Amount of fluorescent material | Vf vol [V] | Luminance of light emission Φv [lm] | Chromaticity coordinates | |
|---|---|---|---|---|---|
| | | | | x | y |
| Example 23 | 2.5 g | 3.36 | 10.9 | 0.174 | 0.158 |
| Example 24 | 5 g | 3.36 | 14.4 | 0.190 | 0.244 |
| Example 25 | 7.5 g | 3.36 | 15.8 | 0.205 | 0.320 |
| Example 26 | 10 g | 3.38 | 19.1 | 0.225 | 0.424 |
| Example 27 | 15 g | 3.36 | 18.0 | 0.245 | 0.521 |
| Example 28 | 20 g | 3.37 | 18.4 | 0.262 | 0.593 |
| Example 29 | 30 g | 3.38 | 16.0 | 0.279 | 0.652 |

| | Emission spectrum | | |
|---|---|---|---|
| | LED Peak wavelength (nm) | Fluorescent material Peak wavelength (nm) | Ratio in intensity of component Fluorescent material/LED |
| Example 23 | 453 | 533 | 0.2 |
| Example 24 | 452 | 535 | 0.3 |
| Example 25 | 451 | 535 | 0.5 |
| Example 26 | 452 | 533 | 1.0 |
| Example 27 | 453 | 535 | 2.0 |
| Example 28 | 452 | 534 | 4.2 |
| Example 29 | 454 | 536 | 14.8 |

These results show that colors of light from the light emitting devices according to Examples 23 to 29 before passing the filter lie on a substantially straight line connecting two points of chromaticity coordinates x=0.174, y=0.158 and x=0.279, y=0.654. The light emitting device 100 of Example 23 emits blue light. Yellow-color light component gradually increases from Example 23 to Example 29, so that the light emitting device 100 of Example 7 emits green light. The ratio in intensity of component of peak emission wavelength of the fluorescent material 50 to the component of peak emission wavelength of the light emitting element 10 gradually increases from 0.2 in Example 23 to 14.8 in Example 29. This means that, as the content of the fluorescent material 50 increases, intensity of light which is emitted by the light emitting element 10 and passes between the particles of the fluorescent material 50 so as to emerge from the light emitting device 100 decreases.

Then emission characteristics of the light emitting devices 100 according to Examples 23 to 29 are measured. Table 8 shows the emission characteristics of the light emitting devices 100 according to Examples 23 to 29, measured after the light has passed the filter. Luminance values of emission of the light emitting devices 100 according to Examples 24 to 29 are given in terms of percentage relative to that of the light emitting device 100 of Example 23.

TABLE 8

| | Amount of fluorescent material | Chromaticity coordinates | | Luminance emission |
|---|---|---|---|---|
| | | x | y | (%) |
| Example 23 | 2.5 g | 0.329 | 0.654 | 100 |
| Example 24 | 5 g | 0.330 | 0.654 | 142 |
| Example 25 | 7.5 g | 0.331 | 0.653 | 162 |
| Example 26 | 10 g | 0.335 | 0.650 | 200 |
| Example 27 | 15 g | 0.334 | 0.652 | 192 |
| Example 28 | 20 g | 0.339 | 0.649 | 188 |
| Example 29 | 30 g | 0.342 | 0.646 | 176 |

These results show that the values of chromaticity coordinates of the light from the light emitting device 100 remain substantially constant regardless of changes in the content of the fluorescent material 50 included in the sealing member 60. Luminance of emission, in contrast, increases gradually from Example 23 to Example 26 and decreases gradually from Example 26 to Example 29, and reaches a peak in Example 26.

Table 7 and Table 8 show that light, obtained by exciting the SrGa$_2$S$_4$:Eu fluorescent material by using a light emitting element having a peak emission wavelength located at 453 nm and passing the light through a filter which cuts off light of wavelengths shorter than 480 nm, has substantially constant color with chromaticity coordinates in ranges of x=0.329 to 0.342 and y=0.646 to 0.654. Luminance of light emitted by the light emitting device after passing the filter reaches a peak when the ratio in intensity of the component having a peak emission wavelength of the fluorescent material to the component having a peak emission wavelength of the light emitting element is 1.0. This means that higher luminance cannot be achieved simply by decreasing the intensity of light emitted by the light emitting element which serves as the exciting light source.

The luminance of light emission can be decreased while keeping the color constant by using a slight amount of the fluorescent material 50 or an excessive amount of the fluorescent material 50. When the content of the fluorescent material 50 is decreased, it is made possible to manufacture the light emitting device 100 at a lower cost. When the content of the fluorescent material 50 is increased, it is made possible to reduce the heat accumulated in the filter.

The results of Examples 1 to 29 show that light emitting devices 100 which emit light with different color tones can be provided by changing the combination of the light emitting element 10 and the fluorescent material 50 while using the same filter.

The light emitting device of the present invention can be used in such applications as signal, signboard, automobile and illumination.

What is claimed is:

1. A light emitting device comprising:
   a light emitting element having a peak emission wavelength shorter than 490 nm;
   a fluorescent material for wavelength conversion which absorbs light emitted by said light emitting element and emits light of a wavelength longer than that of the light from said light emitting element; and
   a filter which cuts off a part of a mixed light produced by mixing the light from said light emitting element and the light from said fluorescent material, wherein said filter transmits light of wavelengths shorter than 480 nm at a rate of about 10% or less if a maximum transmittance of light of wavelengths ranging from 495 nm to 730 nm is assumed to be 100%, wherein the mixed light before passing said filter has a ratio of an intensity of a peak emission wavelength of said fluorescent material to an intensity of peak emission wavelength of said light emitting element that is about 1.0 or higher and not higher than about 20, wherein the mixed light before passing said filter consists of a light component having a peak emission wavelength of said light emitting element and a light component having a peak emission wavelength of said fluorescent material, and has a y value of a chromaticity coordinate on the chromaticity diagram according to CIE 1931 not lower than 0.400, and wherein the light transmitted through the filter has chromaticity coordinates on the chromaticity diagram according to CIE 1931 plotted in a region defined by a first point (x=0.450, y=0.450), a second point (x=0.250, y=0.650), a third point (x=0.250, y=0.750) and a fourth point (x=0.550, y=0.450) and in a region defined by a closed curve consisting of the monochromatic locus and the purple boundary.

2. The light emitting device according to claim 1, wherein the fluorescent material is at least one member selected from among alkaline earth metal element aluminate fluorescent material, alkaline earth element silicate, alkaline earth element thiogallate, rare earth element aluminate, and oxide-nitride-based fluorescent material.

* * * * *